United States Patent
Iwayama et al.

(10) Patent No.: US 11,147,156 B2
(45) Date of Patent: Oct. 12, 2021

(54) COMPOSITE MEMBER, HEAT RADIATION MEMBER, SEMICONDUCTOR DEVICE, AND METHOD OF MANUFACTURING COMPOSITE MEMBER

(71) Applicants: Sumitomo Electric Industries, Ltd., Osaka (JP); A.L.M.T. Corp., Tokyo (JP)

(72) Inventors: Isao Iwayama, Osaka (JP); Shigeki Koyama, Toyama (JP); Masashi Okamoto, Toyama (JP); Yuta Inoue, Toyama (JP); Hiroyuki Kontani, Toyama (JP); Takehisa Yamamoto, Toyama (JP)

(73) Assignees: Sumitomo Electric Industries, Ltd., Osaka (JP); AL.M.T. CORP., Tokyo (JP)

( * ) Notice: Subject to any disclaimer, the term of this patent is extended or adjusted under 35 U.S.C. 154(b) by 30 days.

(21) Appl. No.: 16/349,340

(22) PCT Filed: Nov. 8, 2017

(86) PCT No.: PCT/JP2017/040324
§ 371 (c)(1),
(2) Date: May 13, 2019

(87) PCT Pub. No.: WO2018/105297
PCT Pub. Date: Jun. 14, 2018

(65) Prior Publication Data
US 2019/0297725 A1    Sep. 26, 2019

(30) Foreign Application Priority Data
Dec. 6, 2016    (JP) .............................. JP2016-236959

(51) Int. Cl.
*H05K 1/02* (2006.01)
*H01L 23/373* (2006.01)
(Continued)

(52) U.S. Cl.
CPC .......... *H05K 1/0271* (2013.01); *C22C 26/00* (2013.01); *C22C 29/06* (2013.01); *C22C 29/065* (2013.01);
(Continued)

(58) Field of Classification Search
None
See application file for complete search history.

(56) References Cited

U.S. PATENT DOCUMENTS

2004/0031545 A1    2/2004    Okamoto et al.
2009/0280351 A1*   11/2009   Hirotsuru .............. C04B 41/009
                                                            428/613

FOREIGN PATENT DOCUMENTS

EP    01973157 A1    9/2008
EP    02012354 A1    1/2009
(Continued)

*Primary Examiner* — Nicholas J Tobergte
*Assistant Examiner* — Kien C Ly
(74) *Attorney, Agent, or Firm* — Faegre Drinker Biddle & Reath LLP

(57) ABSTRACT

A composite member includes a substrate composed of a composite material containing a metal and a non-metal. One surface of the substrate has spherical warpage of which radius of curvature R is not smaller than 5000 mm and not greater than 35000 mm. A sphericity error is not greater than 10.0 μm, the sphericity error being defined as an average distance between a plurality of measurement points on a contour of a warped portion of the substrate and approximate arcs defined by the plurality of measurement points.

(Continued)

The substrate has a thermal conductivity not lower than 150 W/m·K and a coefficient of linear expansion not greater than 10 ppm/K.

10 Claims, 6 Drawing Sheets

(51) Int. Cl.
    *H05K 1/18*           (2006.01)
    *H05K 1/03*           (2006.01)
    *C22C 29/06*         (2006.01)
    *H05K 7/20*          (2006.01)
    *C22C 26/00*        (2006.01)

(52) U.S. Cl.
    CPC ......... *H01L 23/373* (2013.01); *H05K 1/0204* (2013.01); *H05K 1/0353* (2013.01); *H05K 1/181* (2013.01); *H05K 7/20* (2013.01); *H05K 2201/10378* (2013.01)

(56) References Cited

FOREIGN PATENT DOCUMENTS

| JP | 2004-47619 A | 2/2004 |
|----|--------------|--------|
| JP | 2012-197496 A | 10/2012 |

\* cited by examiner

COMPOSITE MEMBER, HEAT RADIATION MEMBER, SEMICONDUCTOR DEVICE, AND METHOD OF MANUFACTURING COMPOSITE MEMBER

TECHNICAL FIELD

The present invention relates to a composite member, a heat radiation member, a semiconductor device, and a method of manufacturing a composite member.

The present application claims priority to Japanese Patent Application No. 2016-236959 filed on Dec. 6, 2016, the entire contents of which are incorporated by reference.

BACKGROUND ART

PTL 1 discloses a magnesium-based composite material (which may be called Mg—SiC below) in which magnesium (Mg) or an alloy thereof and silicon carbide (SiC) make a composite as a material suitable for a heat radiation member (a heat spreader) of a semiconductor element.

A heat radiation member of a semiconductor element is representatively in a form of a flat plate, and one surface thereof is used as a mount surface where a semiconductor element or the like is to be mounted and the other surface thereof is used as a placement surface to be fixed to a placement target such as a cooling apparatus. PTL 1 discloses that the placement surface of the heat radiation member composed of Mg—SiC is warped as projecting, the heat radiation member is pressed against the placement target to straighten the warpage, and the heat radiation member is brought in intimate contact with the placement target in a pressurized state by fixing the heat radiation member with a bolt in this state.

CITATION LIST

Patent Literature

PTL 1: Japanese Patent Laying-Open No. 2012-197496

SUMMARY OF INVENTION

A composite member according to the present disclosure includes a substrate composed of a composite material containing a metal and a non-metal, one surface of the substrate having spherical warpage of which radius of curvature R is not smaller than 5000 mm and not greater than 35000 mm, a sphericity error being not greater than 10.0 µm, the sphericity error being defined as an average distance between a plurality of measurement points at which a contour of a warped portion of the substrate is measured and approximate arcs defined by the plurality of measurement points, and the substrate having a thermal conductivity not lower than 150 W/m·K and a coefficient of linear expansion not greater than 10 ppm/K.

A method of manufacturing a composite member according to the present disclosure is a method of manufacturing a composite member for manufacturing a composite member by processing a substrate material composed of a composite material containing a metal and a non-metal, the composite member including the processed substrate, and the method includes a pressing step of performing heat pressing by accommodating the substrate material in a die of which radius of curvature is not smaller than 5000 mm and not greater than 35000 mm, the pressing step including maintaining a heating temperature exceeding 200° C. and an applied pressure not lower than 10 kPa for a prescribed period of time and performing cooling from the heating temperature to a temperature not higher than 100° C. while a state of application of a pressure not lower than 80% of the applied pressure is maintained.

DETAILED DESCRIPTION

Figure 1:
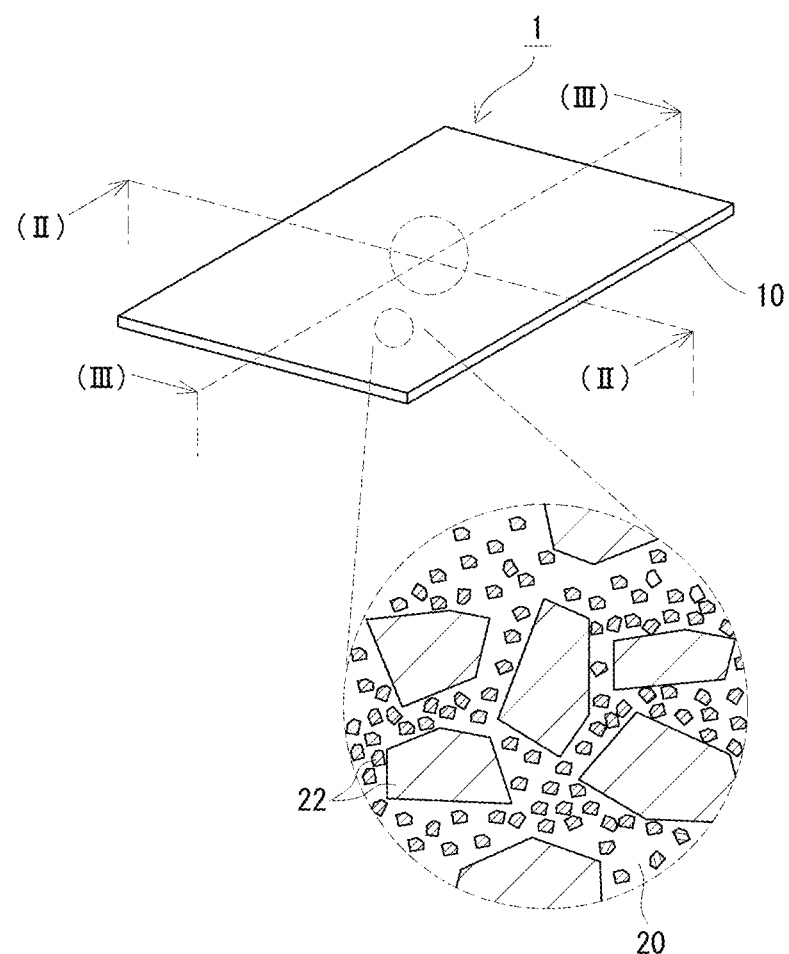
FIG. 1 is a schematic perspective view of a composite member in an embodiment.
Figure 2:
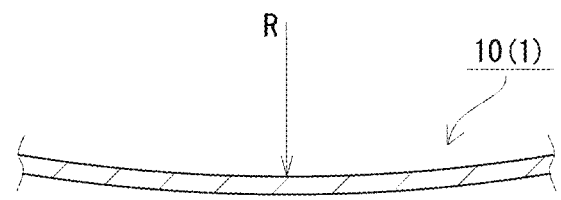
FIG. 2 is a partial vertical cross-sectional view of the vicinity of the center of a substrate of the composite member in the embodiment cut along the line (II)-(II) shown in FIG. 1.
Figure 3:
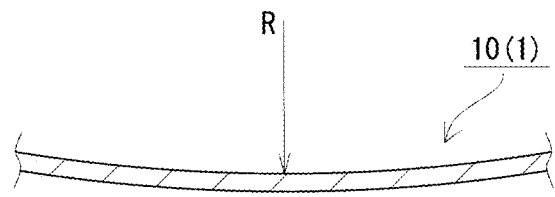
FIG. 3 is a partial lateral cross-sectional view of the vicinity of the center of the substrate of the composite member in the embodiment cut along the line (III)-(III) shown in FIG. 1.

Problem to be Solved by the Present Disclosure

With higher output from an electronic device, an amount of heat generation at the time when a semiconductor element included in the electronic device operates tends to increase. Therefore, various heat radiation members represented by a heat radiation member of a semiconductor element and a material therefor are desirably excellent in heat radiation property for a long period of time from an initial stage of use.

PTL 1 discloses obtaining a substrate including a placement surface warped as projecting and a mount surface warped as being recessed to correspond to the projection by sandwiching a substrate material composed of Mg—SiC between spherically curved dies and holding the substrate material for a prescribed period of time in a heated and loaded state. The present inventors, however, have found as a result of their studies that, even though a radius of curvature of a curved die is controlled, accuracy in forming is poor depending on a manufacturing condition and a surface shape of a warped substrate may greatly deviate from a spherical surface. A substrate which greatly deviates from the spherical surface and has inappropriate warpage tends to be poorer in capability of heat conduction to a placement target than a substrate having appropriate spherical warpage because such a substrate cannot be brought in intimate contact with a placement target or a state of intimate contact thereof is unstable even though such a substrate is pressed against the placement target (see Test Example 3 which will be described later).

The present inventors have found that, even though a radius of curvature of the curved die is controlled as described above, depending on a manufacturing condition, deformation due to a thermal history may occur. For example, when this substrate is used for a heat radiation member of a semiconductor element, such a thermal history as soldering of an insulating substrate which insulates a semiconductor element and the substrate from each other or a thermal cycle during use is applied to the substrate. The thermal history leads to deformation or an unstable shape of the substrate and to deviation from an initially warped shape (a designed shape), which may make a state of intimate contact between the substrate and a placement target unstable and lower capability of heat conduction to a placement target.

One object is to provide a composite member excellent in intimate contact with a placement target. Another object is to provide a method of manufacturing a composite member which allows manufacturing of a composite member excellent in intimate contact with a placement target.

Another object is to provide a heat radiation member excellent in intimate contact with a placement target and a semiconductor device.

Effect of the Present Disclosure

The composite member according to the present disclosure is excellent in intimate contact with a placement target. The method of manufacturing a composite member according to the present disclosure allows manufacturing of a composite member excellent in intimate contact with a placement target.

Description of Embodiment of the Invention of the Present Application

The present inventors have studied about a substrate stable in a state of intimate contact with a placement target and excellent in capability of heat conduction to a placement target by providing spherical warpage under various conditions to a substrate composed of a composite material in which a metal and a non-metal make a composite such as Mg—SiC. PTL 1 discloses a difference in surface displacement along a diagonal of a rectangular substrate as an indicator of an amount of warpage. Even though the amount of warpage is adopted as the indicator, however, a spherical state cannot appropriately be known and it may be difficult to recognize a substrate which greatly deviates from a spherical surface as described above. A sphericity error which will be described later is employed as an indicator which more properly indicates a spherical state in a simplified manner. The present inventors have found that, when spherical warpage is formed in a heated and pressurized state by using a die such as a spherically curved die described above, a substrate of which sphericity error which will be described later satisfies a specific range and which is stable in state of intimate contact with a placement target, excellent in capability of heat conduction to a placement target, and composed of a composite material is obtained by setting a radius of curvature Rd of the die, a heating temperature, and an applied pressure to be within specific ranges and performing cooling under a specific condition. The invention of the present application is based on these findings.

Embodiments of the invention of the present application are initially listed and described.

(1) A composite member according to one manner of the present disclosure includes a substrate composed of a composite material containing a metal and a non-metal, one surface of the substrate having spherical warpage of which radius of curvature R is not smaller than 5000 mm and not greater than 35000 mm, a sphericity error being not greater than 10.0 µm, the sphericity error being defined as an average distance between a plurality of measurement points at which a contour of a warped portion of the substrate is measured and approximate arcs defined by the plurality of measurement points, and the substrate having a thermal conductivity not lower than 150 W/m·K and a coefficient of linear expansion not greater than 10 ppm/K.

The warpage is assumed as projecting warpage, and a sphericity error of the projecting warpage satisfies a condition not greater than 10.0 µm. The composite member includes such a form that one surface of the substrate has spherically projecting warpage and opposed the other surface has recessed warpage and such a form that one surface of the substrate has spherically projecting warpage and the other surface is flat (a form of a spherical segment).

The composite member has spherical warpage of which radius of curvature R is within a specific range in one surface of the substrate and a sphericity error of the warped portion is 10.0 µm or smaller. A surface shape of such a warped portion can be concluded as being close to a part of a truly spherical surface (a spherical cap) (of which details will be described later). Since the composite member has a spherically warped portion close to a spherical cap, it can be brought in intimate contact with a placement target by uniformly pressing the warped portion against the placement target and a stable state of intimate contact can be ensured. In addition, the composite member has a high thermal conductivity and hence it is excellent in capability of heat conduction to the placement target. Since the composite member has the spherically warped portion close to a spherical cap and has a small coefficient of linear expansion, the composite member is less likely to deform even though a thermal history including temporary heat treatment such as soldering is applied thereto. Specifically, non-uniform heat expansion and shrinkage during soldering is less likely and such change as restoration of warpage or variation in spherical state is less likely. Since deformation is less likely, the composite member can more readily maintain the state of intimate contact described above. The composite member is representatively small in residual stress. When the composite member includes a surface coating different in coefficient of linear expansion from the composite member, variation over time in amount of warpage due to thermal stress during a thermal cycle (a thermal ratchet phenomenon) is also less likely by setting a thickness of the surface coating to be within a certain range (see a section of metallic coating which will be described later). By employing such a composite member, for example, for a material for a heat radiation member of a semiconductor element, a semiconductor device excellent in heat radiation property can be constructed while a state of intimate contact between the heat radiation member and a placement target is maintained for a long period of time from an initial stage of use. The state of intimate contact is readily maintained also because of a small difference in coefficient of linear expansion from a semiconductor element and a peripheral component thereof.

A sphericity error is measured as below (which will be detailed later). A rectangular measurement region centered around the center of gravity of the substrate is defined except for an outer periphery of the substrate and a peripheral region including the vicinity thereof. Ten straight lines in total including long sides of the rectangle and being in parallel to the long sides (which are called contour extraction lines below) are defined. A plurality of measurement points which define a contour of a warped portion of the substrate are taken along each contour extraction line. Ten approximate arcs are defined by approximating the plurality of measurement points with the least square method. A distance between each measurement point and an approximate arc is found and an average of the distances is defined as a sphericity error. It can be concluded that, as a sphericity error is smaller, the contour of the warped portion and the approximate arc match with each other and each contour follows an arc. It can be concluded that, when each contour is arc, a surface shape defined by a set of these contours defines a part of a truly spherical surface (a spherical cap). Therefore, the composite member small in sphericity error as described above can be concluded as having a warped portion of which surface shape is in a spherical shape close to a part of the truly spherical surface. The sphericity error is considered as being suitable as an indicator which indicates a degree of a spherical state of the warped portion.

(2) An example of the composite member includes such a form that a content of the non-metal is not lower than 55 volume %.

Since the form is high in content of the non-metal, thermal conductivity tends to be higher and a coefficient of linear expansion tends to be smaller. Therefore, the form is excellent in intimate contact with a placement target and is less likely to deform in bonding of an insulating substrate.

(3) An example of the composite member includes such a form that a rate of variation in radius of curvature R between before and after application of 10, 100, and 1000 thermal cycles from −60° C. to 175° C. is not higher than 20%.

It can be concluded that the form is less likely to deform even in application of a thermal cycle and specific spherical warpage described above is readily maintained for a long period of time. Therefore, the form is less likely to deform even in application of a thermal cycle and excellent in intimate contact with a placement target.

(4) An example of the composite member includes such a form that a rate of variation in radius of curvature R between before and after heat treatment at 300° C.×one hour is not higher than 20%.

It can be concluded that the form is less likely to deform even in application of heat treatment and specific spherical warpage described above is readily maintained. A condition for heat treatment can be concluded as one example of a soldering condition described above. Therefore, the form is less likely to deform even though it is used for a heat radiation member of a semiconductor element and subjected to a thermal history such as soldering, and is excellent in intimate contact with a placement target. A form (5) small in difference in residual stress between front and rear of the substrate which will be described later is likely to have such characteristics as the rate of variation not higher than 20%.

(5) An example of the composite member includes such a form that one surface of the substrate has projecting spherical warpage and opposed the other surface has recessed warpage and an absolute value |X1−X2| of a difference in residual stress is less than $10^5 \times (H/L^2)$ (MPa), where X1 (MPa) represents residual stress at a gravity center position in a projecting surface of the substrate, X2 (MPa) represents residual stress at a gravity center position in a recessed surface of the substrate, L (mm) represents a length of a diagonal of a rectangle containing an outer periphery of the substrate, and H (mm) represents a thickness of the substrate.

When the substrate is, for example, rectangular, the rectangle containing the outer periphery of the substrate corresponds to an outer profile of the substrate. The smallest rectangle is assumed as the contained rectangle.

The form is small in difference in residual stress between the projecting surface and the recessed surface in the warped portion of the substrate. Therefore, when residual stress is released by application of a thermal history such as soldering or a thermal cycle, deformation based on the difference in residual stress is less likely. Therefore, the form is less likely to deform even in application of heat resulting from soldering or a thermal cycle and is excellent in intimate contact with a placement target. A gentle warping shape of which radius of curvature R is not smaller than 5000 mm is larger in range of elastic deformation than in range of plastic deformation in the vicinity of the surface of the substrate. In this regard, the composite member according to one manner of the present disclosure can be concluded as having a shape susceptible to change in shape at the time of release of residual stress by the thermal history described above. Therefore, the difference in residual stress in the substrate satisfying the specific range as in the form (5) can be concluded as being effective in lessening of deformation. Examples of the composite member according to (5) include such a form as not substantially including a metallic coating which covers a surface of the substrate or a form including a metallic coating having a thickness not greater than 100 µm, smaller than 50 µm, and particularly not greater than 20 µm if it includes any metallic coating.

(6) An example of the composite member according to (5) in which the difference in residual stress between the projecting surface and the recessed surface is within the specific range includes such a form that both of residual stress at the gravity center position in the projecting surface of the substrate and residual stress at the gravity center position in the recessed surface of the substrate are compressive stress or tensile stress.

The form is likely to be smaller in difference in residual stress and more unsusceptible to deformation based on the difference in residual stress. Therefore, the form is more unsusceptible to deformation even though it is subjected to heat resulting from soldering or a thermal cycle and is excellent in intimate contact with a placement target.

(7) An example of the composite member includes such a form that magnesium or a magnesium alloy is adopted as the metal and the non-metal includes SiC.

Since the form includes the substrate composed of Mg—SiC, it is lighter, higher in thermal conductivity, and better in heat radiation property than an example including a substrate composed of a composite material of aluminum (Al) or an alloy thereof and SiC (which may be called Al—SiC below). Mg or an alloy thereof is more readily relaxed in stress than Al or an alloy thereof. Therefore, the form is small in residual stress described above and is likely to be smaller in difference in residual stress between the projecting surface and the recessed surface, and residual stress is easily removed therefrom. Therefore, the form is more unsusceptible to deformation even in application of a thermal history such as a thermal cycle or soldering and particularly excellent in intimate contact with a placement target.

(8) An example of the composite member includes such a form that aluminum or an aluminum alloy is adopted as the metal and the non-metal includes SiC.

Since the form includes a substrate composed of Al—SiC, it is lighter than an example including a substrate composed of a composite material containing copper or silver or an alloy thereof. Therefore, the form is excellent in intimate contact with a placement target and light in weight.

(9) A heat radiation member according to one manner of the present disclosure includes the composite member described in any one of (1) to (8).

The heat radiation member includes the composite member which is high in thermal conductivity and small in coefficient of linear expansion and has specific spherical warpage described above. Therefore, the heat radiation member can be brought in intimate contact with a placement target as described above and a state of intimate contact can be maintained in a stable manner. The heat radiation member is less likely to deform even in application of a thermal history such as soldering. Preferably, the composite member is less likely to deform even in application of a thermal cycle. Therefore, the heat radiation member maintains a state of intimate contact with a placement target for a long period of time from an initial stage of use, satisfactorily conducts heat from a semiconductor element to a placement target therethrough, and is excellent in heat radiation property. Such a heat radiation member can suitably be used as a heat radiation member of a semiconductor element or for a component of a semiconductor device.

(10) A semiconductor device according to one manner of the present disclosure includes the heat radiation member according to one manner of the present disclosure and a semiconductor element mounted on the heat radiation member.

The semiconductor device includes the composite member which is high in thermal conductivity and small in coefficient of linear expansion and has specific spherical warpage described above as the heat radiation member. In the semiconductor device, the heat radiation member can be brought in intimate contact with a placement target such as a cooling apparatus as described above and a state of intimate contact can be maintained in a stable manner. The heat radiation member is less likely to deform even in application of a thermal history such as soldering. Preferably, the heat radiation member is less likely to deform even in application of a thermal cycle. Therefore, in the semiconductor device, heat satisfactorily conducts from a semiconductor element to a placement target through the heat radiation member, and the semiconductor device is excellent in heat radiation property for a long period of time from an initial stage of use. The semiconductor device is exemplified by a semiconductor module such as a power module.

(11) A method of manufacturing a composite member according to one manner of the present disclosure is a method of manufacturing a composite member for manufacturing a composite member by processing a substrate material composed of a composite material containing a metal and a non-metal, the composite member including the processed substrate, and the method includes a pressing step of performing heat pressing by accommodating the substrate material in a die of which radius of curvature is not smaller than 5000 mm and not greater than 35000 mm, the pressing step including maintaining a heating temperature exceeding 200° C. and an applied pressure not lower than 10 kPa for a prescribed period of time and performing cooling from the heating temperature to a temperature not higher than 100° C. while a state of application of a pressure not lower than 80% of the applied pressure is maintained.

In the method of manufacturing a composite member, in heat pressing with the use of a die of which radius of curvature Rd is set to a specific dimension, a heating temperature and an applied pressure are set to be within specific ranges, and specific cooling from the heating temperature to a specific temperature in a pressurized state is performed. Since the heating temperature and the applied pressure during heat pressing satisfy the specific ranges and are relatively high, plastic deformation is accelerated and a spherical shape of the die can accurately be transferred to a substrate material. Since the cooling process is performed in a pressurized state as described above, residual stress can be released, change in shape or distortion in shape which may be caused by cooling in a non-pressurized state can be suppressed, and the substrate material can be provided with a warped shape as high in sphericity as the die. Preferably, radius of curvature Rd of the die can substantially be transferred to the substrate material. It is considered that, during cooling in a non-pressurized state, for example, stress caused by local heat shrinkage due to non-uniform cooling from a surface of the substrate material to the inside is produced and deformation from the transferred shape described above may occur. With some of the stress remaining as residual stress, deformation is likely at the time of application of a thermal history such as a thermal cycle or soldering described above. Therefore, the method of manufacturing a composite member can allow manufacturing of a composite member including a substrate of which radius of curvature R is close or preferably substantially equal to radius of curvature Rd of the die and of which one surface has projecting spherical warpage and opposed the other surface has recessed warpage corresponding to the projecting warpage. For example, when dies different from each other in curvature, that is, a first die having a projecting surface and a second die having a recessed surface, are employed as dies, a composite member including a substrate different in curvature between the projecting surface and the recessed surface is obtained. Alternatively, for example, when a first die having a projecting surface and a second die having a flat forming surface are employed as dies, a composite member like a spherical segment including a substrate of which one surface is warped as projecting and the other surface is flat is obtained. When the projecting surface has a small radius of curvature, the radius of curvature can also be deformed stepwise by repeating pressing by using a plurality of dies as necessary. The method of manufacturing a composite member can be used for manufacturing a composite member according to one manner of the present disclosure described above.

Details of Embodiment of the Invention of the Present Application

Figure 7:
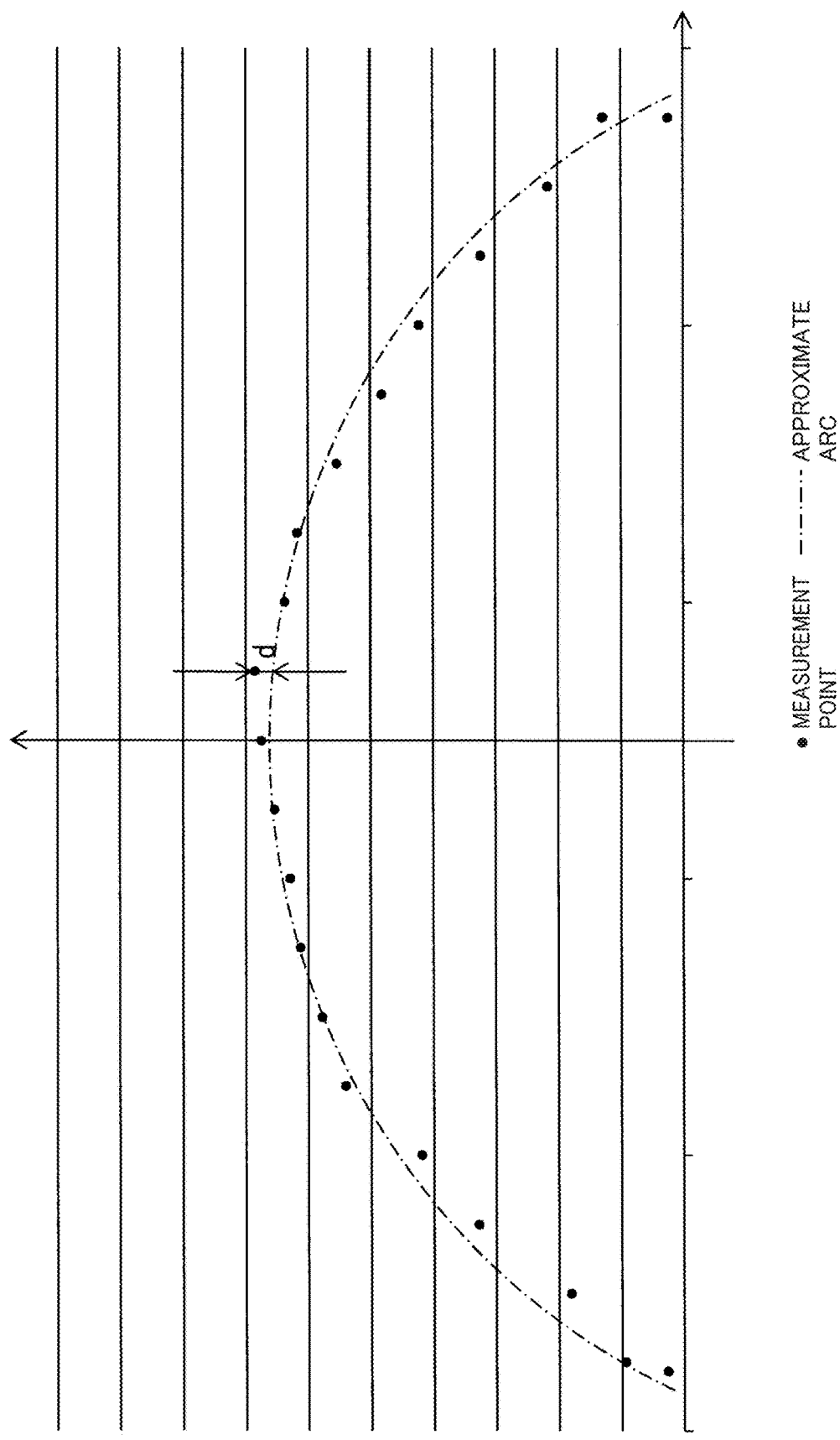
FIG. 7 is an illustrative diagram illustrating a method of measuring a sphericity error and showing each measurement point defining a contour extracted along contour extraction line Ln, an approximate arc, and a distance d between a measurement point and an approximate arc.
Figure 8:
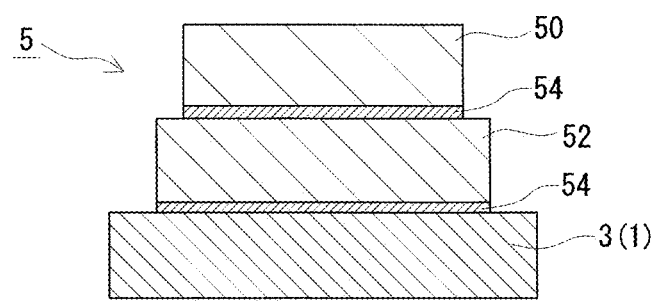
FIG. 8 is a schematic cross-sectional view schematically showing an element of a semiconductor device in the embodiment.

An embodiment of the invention of the present application will specifically be described below. A composite member 1 according to the embodiment will be described with reference to FIGS. 1 to 7, a heat radiation member 3 according to the embodiment and a semiconductor device 5 according to the embodiment will be described sequentially with reference to FIG. 8, and a method of manufacturing a composite member according to the embodiment will subsequently be described. FIG. 1 shows a non-metal 22 in an exaggerated manner for facilitating understanding. FIG. 8 shows only the vicinity of heat radiation member 3 and a semiconductor element 50 included in semiconductor device 5 and does not show a bonding wire, a package, or a cooling apparatus (a placement target).

[Composite Member]
(Overview)

Composite member 1 in the embodiment includes a substrate 10 composed of a composite material containing a metal 20 and non-metal 22 as shown in FIG. 1. Substrate 10 is in such a specific shape that one surface thereof has spherical warpage of which radius of curvature R is not smaller than 5000 mm and not greater than 35000 mm (FIGS. 2 and 3) and a sphericity error which will be described later is not greater than 10.0 µm. Substrate 10 has a thermal conductivity not lower than 150 W/m·K and a coefficient of linear expansion not greater than 10 ppm/K. Composite member 1 including substrate 10 which is not only excellent in capability of heat conduction but also small in amount of thermal expansion and shrinkage and is in the specific shape described above can be used for various heat radiation members and suitably used in particular for heat radiation member 3 of semiconductor element 50 (FIG. 8). When substrate 10 is fixed to a placement target (not shown) of heat radiation member 3 with such a fastening member as a bolt while a warped portion of substrate 10 is pressed against the placement target, heat radiation member 3 can be brought in intimate contact with the placement target, and in addition, a state of intimate contact is stable and heat from semiconductor element 50 can satisfactorily conduct to the placement target through heat radiation member 3. Composite member 1 in the embodiment is less likely to deform even though an insulating substrate 52 or the like is soldered, and the state of intimate contact is more readily maintained. Preferably, composite member 1 in the embodiment is less likely to deform even in application of a thermal cycle. Warpage close to a spherical cap, less likeliness of deformation, and excellent capability of heat conduction to a placement target will specifically be described in Test Examples which will be described later.

(Substrate)

Substrate 10 will mainly be described in detail below.

Substrate 10 is a main element of composite member 1 and it is a formed object composed of a composite material containing metal 20 and non-metal 22.

<Metal>

Examples of metal 20 in substrate 10 include what is called a pure metal representing one type selected from the group consisting of Mg, Al, Ag, and Cu or an alloy based on one type of metal element selected from the group. A magnesium alloy, an aluminum alloy, a silver alloy, and a copper alloy having a known composition can be made use of.

<Non-Metal>

Examples of non-metal 22 in substrate 10 include ceramics such as a carbide, an oxide, a nitride, a boride, a silicide, and a chloride of a metal element or a non-metal element, a non-metal element such as silicon (Si), and an inorganic material including a carbon material such as diamond and graphite. Specific examples of the ceramics include SiC, AlN, h-BN, c-BN, and $B_4C$. A plurality of types of non-metals 22 can be included as being combined.

Non-metal 22 in substrate 10 representatively exists while a composition, a shape, and a size thereof are substantially maintained in a source material. For example, when powders of a non-metal are employed as a source material, the non-metal exists as powdery particles, and when a formed object such as a porous formed object like a web of a non-metal is employed as a source material, the non-metal exists as the formed object. Substrate 10 in which powders are dispersed is excellent in toughness. Substrate 10 including a porous formed object is higher in heat radiation property because non-metal 22 is continuous like a web in substrate 10 and constructs a heat radiation path.

A content of non-metal 22 in substrate 10 can be selected as appropriate. As a content is higher, in many cases, a thermal conductivity tends to be higher, a coefficient of linear expansion tends to be smaller, mechanical characteristics (for example, rigidity) tend to be higher, and improvement in characteristics can be expected. From a point of view of improvement in characteristics, the content is set to 55 volume % or higher by way of example. In this case, although depending on a composition of metal 20 or non-metal 22, for example, Mg—SiC, Al—SiC, and a diamond composite material tend to satisfy a condition of a thermal conductivity not lower than 150 W/m·K (higher in the diamond composite material) and a coefficient of linear expansion not greater than 10 ppm/K. From a point of view of improvement in characteristics described above, the content can be not lower than 60 volume % or not lower than 70 volume %. When the content is low to some extent, for example, it is easier to fill a die with a source material or to fill a gap in non-metal 22 with molten metal 20, and manufacturability is excellent. From a point of view of manufacturability, the content can be not higher than 90 volume %, not higher than 85 volume %, or not higher than 80 volume %.

<Specific Example of Composite Material>

Specific examples of the composite material include Mg—SiC in which pure magnesium or a magnesium alloy (which may collectively be called Mg etc. below) and SiC mainly make a composite and Al—SiC in which pure aluminum or an aluminum alloy (which may collectively be called Al etc. below) and SiC mainly make a composite. Examples of the diamond composite material include a composite in which silver or a silver alloy and diamond mainly make a composite, a composite in which Mg etc. and diamond mainly make a composite, a composite in which Al etc. and diamond mainly make a composite, and a composite in which copper or a copper alloy and diamond mainly make a composite.

Mg—SiC in which Mg etc. is employed as metal 20 and non-metal 22 includes SiC is lighter in weight, higher in thermal conductivity, and higher in heat radiation property than Al—SiC. Mg—SiC can achieve smaller residual stress at a lower temperature and in a shorter period of time than Al—SiC because stress is more likely to relax in metal 20. When one surface has projecting warpage and the other surface has recessed warpage, a difference in residual stress between a projecting surface and a recessed surface tends to be small. Therefore, composite member 1 including substrate 10 composed of Mg—SiC is less likely to deform even in application of a thermal history such as a thermal cycle or soldering. Al—SiC is lighter in weight than an example containing silver, copper, or an alloy thereof as metal 20, and higher in corrosion resistance than Mg etc. The diamond composite material is very high in thermal conductivity and further high in heat radiation property.

<Outer Profile>

Substrate 10 representatively has a rectangular outer profile (a two-dimensional shape defined by an outer periphery of substrate 10). Rectangular substrate 10 is advantageous in that (1) it can readily be formed and it is excellent in manufacturability and (2) an area for placement of a mount component such as semiconductor element 50 can sufficiently be secured when the substrate is used for heat radiation member 3 of semiconductor element 50. The outer profile of substrate 10 can be modified in accordance with an application, a shape and the number of mount components, and a placement target. Examples of the outer profile of substrate 10 include a polygonal shape such as a hexagonal shape, an annular shape, and an elliptical shape.

<Size>

A size of substrate 10 can be selected as appropriate in accordance with an application or an area of mount of a mount component described above. For example, a rectangle containing a two-dimensional shape defined by the outer periphery of substrate 10 is defined (corresponding to the outer profile of substrate 10 if substrate 10 is rectangular). When the rectangle has a long side not shorter than 100 mm and a short side not shorter than 50 mm, an area of mount is large and large-sized heat radiation member 3 can be constructed. The substrate can have at least a long side of 150 mm and a short side of 120 mm. Since even such large-sized substrate 10 has specific spherical warpage, composite member 1 can be brought in intimate contact with a placement target. Even large-sized substrate 10 is less likely to deform in application of a thermal history during soldering described above.

A thickness of substrate 10 can be selected as appropriate. When composite member 1 is used for a heat radiation member such as heat radiation member 3 of semiconductor element 50, heat can more satisfactorily conduct to a placement target as the composite member is smaller in thickness. As the composite member is greater in thickness, strength as a structural material is higher and heat is more readily radiated because heat spreads in a lateral direction (a direction orthogonal to a direction of thickness). When the composite member has too large a thickness, heat resistance increases. Therefore, substrate 10 has a thickness preferably not greater than 10 mm, not greater than 6 mm, or not greater than 5 mm.

<Warpage>

Radius of Curvature R

Composite member 1 in the embodiment has spherical warpage of which radius of curvature R is not smaller than 5000 mm (5 m) and not greater than 35000 mm (35 m) in one surface of substrate 10. Examples of a specific form include (a) such a form that one surface of substrate 10 has spherically projecting warpage and opposed the other surface has recessed warpage corresponding to the projection and (b) such a form that one surface of substrate 10 has spherically projecting warpage and the other surface is flat. In each form, radius of curvature R and a sphericity error which will be described later of the projecting warpage in substrate 10 satisfy specific ranges. When composite member 1 is used for heat radiation member 3 of semiconductor element 50, in the form (a), representatively, a projecting surface can be set as a placement surface for placement onto a placement target and a recessed surface is set as a mount surface for a mount component such as semiconductor element 50. In the form (b), the warped surface can be set as a placement surface and the flat surface can be set as a mount surface.

When radius of curvature R satisfies the range, an amount of projection of the warped portion is appropriate and the entire warped portion is uniformly pressed against a placement target. When the center of spherical warpage described above is located in the vicinity of the center of gravity in a two-dimensional shape defined by the outer periphery of substrate 10 (an intersection of diagonals in an example of rectangular substrate 10), a pressure tends to be applied more evenly to the entire front and rear surfaces of substrate 10. Thus, the entire warped surface of substrate 10 can be brought in intimate contact with a placement target, and an appropriately pressurized state can be achieved by fixing composite member 1 to the placement target with a bolt or the like. When radius of curvature R is thus within the range, intimate contact with a placement target in an appropriately pressurized state is achieved and a heat radiation property is excellent for a long period of time from an initial stage of use. Deformation is less likely even in case of application of a thermal history such as a thermal cycle. From such a point of view, radius of curvature R can be not smaller than 6000 mm, not smaller than 7000 mm, or not smaller than 8000 mm, and not greater than 34000 mm, not greater than 33000 mm, not greater than 32000 mm, or not greater than 25000 mm. A method of measuring radius of curvature R will be described later.

In manufacturing composite member 1 of which radius of curvature R satisfies the range, for example, a spherical die of which radius of curvature Rd satisfies the range may be used. In particular, by using a method of manufacturing a composite member in the embodiment which will be described later, radius of curvature R of substrate 10 can be close or preferably substantially equal in value to radius of curvature Rd of the die.

Sphericity Error

Composite member 1 in the embodiment has a sphericity error not greater than 10.0 μm. The sphericity error refers to an indicator indicating a degree of a spherical state of a warped portion of composite member 1 and measured in a procedure from (1) to (5) below. Specific description will be given below with reference to FIGS. 6 and 7. Generally, a surface (representatively, a front surface or a rear surface) having a largest area and having projecting warpage among outer peripheral surfaces (front and rear surfaces and side surfaces) of substrate 10 is defined as a main surface, a measurement region 10α is taken from the main surface, a measurement point is extracted from a contour of the warped portion in measurement region 10α, and a sphericity error is found by using the measurement point.

(1) Extraction of measurement region 10α

(2) Extraction of a contour extraction line Ln (n=1 to 10 which should be understood similarly below)

Figure 6:
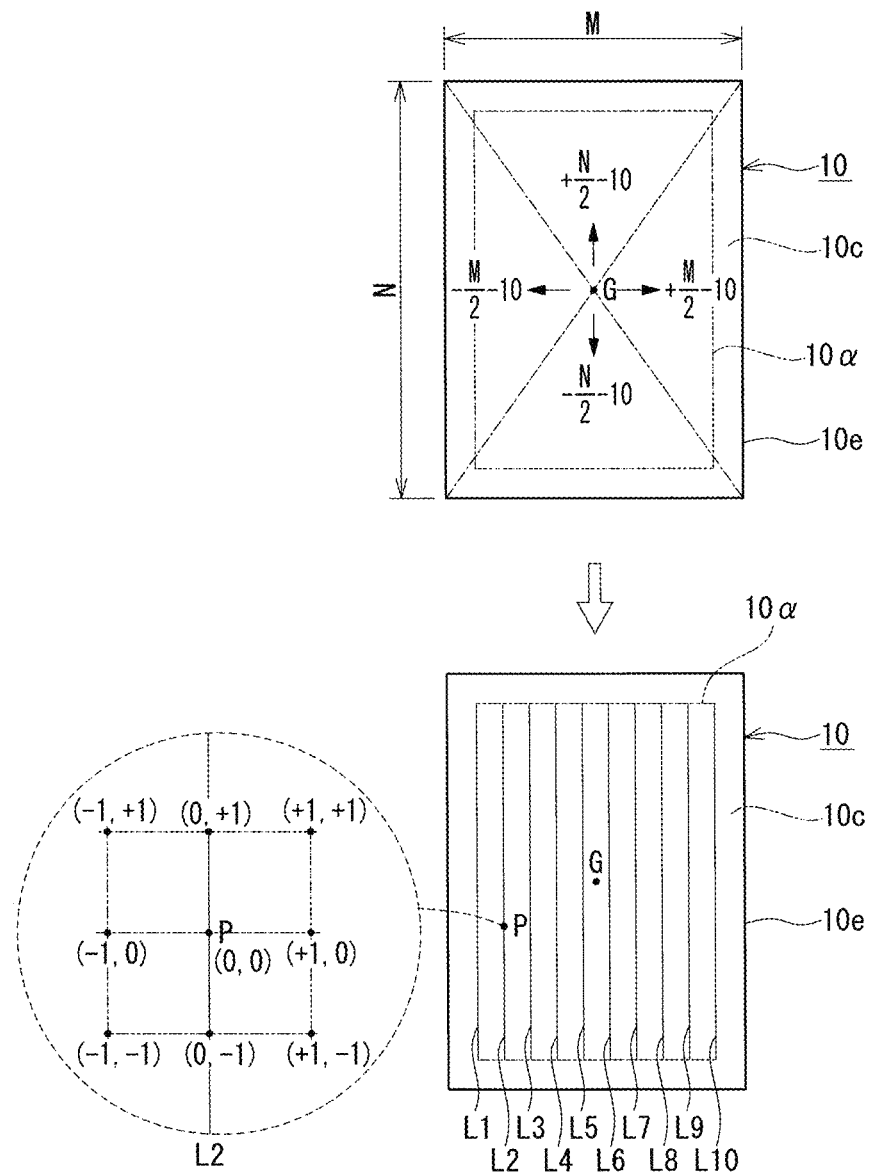
FIG. 6 is an illustrative diagram illustrating a method of measuring a sphericity error and showing a process for extracting a measurement region and a contour extraction line Ln from the substrate.

(3) Extraction of a plurality of measurement points which define a contour of the warped portion (4) Extraction of an approximate arc $10\gamma_n$ from a set $10\beta_n$ of measurement points (5) Calculation of an average of distances d between measurement points and approximate arcs $10\gamma_n$ In a step (1), as shown in an upper portion of FIG. 6, largest rectangular measurement region 10α centered around a center of gravity G of substrate 10 except for an outer periphery 10e of substrate 10 and a peripheral region 10c including the vicinity thereof in the main surface of substrate 10 is defined. Center of gravity G corresponds to the center of a two-dimensional shape defined by outer periphery 10e of substrate 10. When the two-dimensional shape is rectangular as in the example, center of gravity G is located at an intersection of diagonals (shown with a chain dotted line in FIG. 6) of the rectangle. Peripheral region 10c refers to a region extending inward by at most 10 mm from outer periphery 10e of substrate 10, that is, a surrounding region having a width of 10 mm. In the example, rectangular substrate 10 has a short side having a length of M (mm) and a long side having a length of N (mm), center of gravity G thereof is defined as the origin, a direction of the short side is defined as a direction of an X axis, and a direction of the long side is defined as a direction of a Y axis. A rectangle surrounded by four straight lines of a straight line which passes through a point at {(−M/2)−10} from the origin in the direction of the X axis and is in parallel to the direction of the Y axis (a vertical line shown with a chain double dotted line in the upper portion of FIG. 6), a straight line which passes through a point at {(+M/2)−10} and is in parallel to the direction of the Y axis (ditto), a straight line which passes through a point at {(−N/2)−10} from the origin in the direction of the Y axis and is in parallel to the direction of the X axis (a horizontal line shown with a chain double dotted line in the upper portion of FIG. 6), and a straight line which passes through a point at {(+N/2)−10} and is in parallel to the direction of the X axis (ditto) is taken. This rectangular region is defined as measurement region 10α. The reason why peripheral region 10c is excluded from substrate 10 is because, when substrate 10 is used for heat radiation member 3 of semiconductor device 5, a hole for fastening may be provided in a region near outer periphery 10e or peripheral region 10c may not be warped. When the rectangular region taken from the region except for peripheral region 10c as described above includes at least a part of a hole for fastening, a region except for this hole is defined as measurement region 10α.

In a step (2), as shown in a lower portion of FIG. 6, ten contour extraction lines Ln in total including the long sides of the rectangle which define measurement region 10α and being in parallel to the long sides are taken in the main surface of substrate 10. A straight line defining one long side, that is, the straight line which passes through the point at {(−M/2)−10}, and a straight line defining the other long side, that is, the straight line which passes through the point at {(+M/2)−10}, are defined as contour extraction lines L1 and L10, respectively. Contour extraction lines L1 to L10 including L1 and L10 are defined as straight lines which equally divide the rectangle in the direction of the short side.

In a step (3), a plurality of measurement points are taken by determining a contour of the warped portion in the main surface of substrate 10 along each contour extraction line Ln, and a set $10\beta_n$ of measurement points is extracted for each contour extraction line Ln. A commercially available three-dimensional measurement apparatus (for example, a contactless 3D measurement instrument VR3000 manufactured by Keyence Corporation) is used for determining the contour. Measurement points are set at 1-mm interval for one contour extraction line Ln. An average value below is adopted as a value at each measurement point. As shown in a circle shown with a dashed line in FIG. 6 as being enlarged, points P are taken at 1-mm interval from contour extraction line Ln (L2 in FIG. 6), and an average of values at point P and points in the vicinity thereof is taken with point P being defined as the reference. Specifically, with a coordinate of point P (X,Y) being defined as (0,0), values at nine points in total where a condition of X=0 mm±1 mm, Y=0 mm±1 mm is set, that is, values (representatively, amounts of displacement) at (X, Y)=(0, 0), (−1, 0), (+1, 0), (0, −1), (0, +1), (−1, +1), (+1, +1), (−1, −1), and (+1, −1), are taken. It is considered that, by adopting an average value as a value at each measurement point, smoothing is achieved and a smoother shape is extracted more readily than in an example in which a value at point P is used as it is. By performing smoothing processing in connection with measurement points, for example, with the three-dimensional measurement apparatus described above with a condition being set, a value at each measurement point can readily be obtained. FIG. 7 shows a graph schematically showing a result of analysis found with a commercially available three-dimensional measurement apparatus. In FIG. 7, twenty measurement points are set for facilitating understanding. In the graph in FIG. 7, the abscissa represents a position of a point on a straight line in parallel to contour extraction line Ln, and the ordinate represents a position of a point on a straight line which passes through center of gravity G described above and is orthogonal to both of contour extraction line Ln (the direction of the long side) and the direction of the short side. Each point on the abscissa substantially matches with a position of each point on contour extraction line Ln, and each point on the ordinate represents an amount of displacement of the contour with the origin of this graph being defined as the reference. In FIG. 7, a set of twenty measurement points (a legend •) represents a set $10\beta_n$ of measurement points extracted based on contour extraction line Ln.

In a step (4), a plurality of measurement points are approximated with the least square method for each set $10\beta_n$ of measurement points to find ten approximate arcs $10\gamma_n$. Approximate arc $10\gamma_n$ is taken such that distance d between each measurement point in set $10\beta_n$ and approximate arc $10\gamma_n$ corresponding to set $10\beta_n$ is minimized. An average of all obtained distances d is defined as a sphericity error E. An average of radii $R_n$ of ten approximate arcs $10\gamma_n$ is defined as radius of curvature R of the warped portion of the substrate. Approximate arc $10\gamma_n$ and distance d are readily found by using commercially available analysis software such as Excel®.

Figure 4:
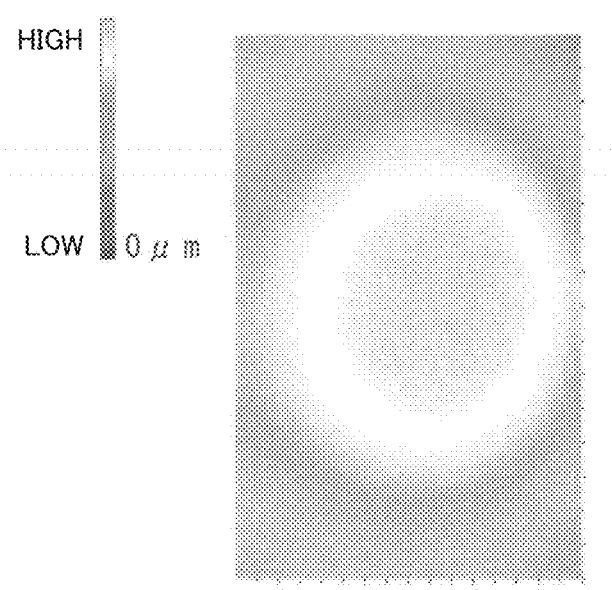
FIG. 4 is an illustrative diagram showing a result of analysis of a surface shape of the composite member in the embodiment with a three-dimensional measurement apparatus, as being converted into two dimensions.

It can be concluded that, as a sphericity error is smaller, warpage is closer to a truly spherical surface having radius of curvature R. For example, when a vertical cross-section (FIG. 2) and a horizontal cross-section (FIG. 3) of rectangular substrate 10 are taken, they are substantially similar in cross-sectional shape. For example, a surface shape of the warped portion of substrate 10 is found by the three-dimensional measurement apparatus described above and a result of analysis in three dimensions is obtained. When substrate 10 is two-dimensionally viewed and height information in the result of analysis in three dimensions is two-dimensionally expressed (converted to two dimensions) as contour lines, the contour lines draw concentric circles. FIG. 4 shows one example of a two-dimensionally converted image of composite member 1 in the embodiment (Test Example 1 which will be described later, sample No. 1-15, Mg—SiC), and a composite member with a region in the vicinity of the outer periphery being excluded (approximately 170 mm×120 mm) is adopted as an analysis sample. This two-dimensionally converted image shows an amount of displacement (μm) from the reference by color with displacement of a corner portion in rectangular substrate 10 being defined as the reference (0 μm). FIG. 4 shows amounts of displacement in the descending order in dark blue, blue, light blue, light green, green, yellow, and orange on a color scale on the left in FIG. 4 (a lower portion of the color scale is shown with dark blue and an upper portion thereof is shown with orange). As shown in FIG. 4, the two-dimensionally converted image of composite member 1 draws concentric circles around the center of rectangular substrate 10 (the center of gravity of the two-dimensional shape of the outer periphery=the intersection of diagonals). It can thus be seen that composite member 1 has a warped portion defined by a surface close to a truly spherical surface having radius of curvature R.

As the sphericity error is smaller, composite member 1 can more uniformly be brought in intimate contact with a placement target or deformation due to non-uniform thermal expansion and shrinkage can further be prevented. In using such composite member 1, for example, for heat radiation member 3 of semiconductor element 50, even though semiconductor element 50 or the like is mounted at any position on substrate 10, heat satisfactorily conducts to a placement target such as a cooling apparatus from semiconductor element 50 through substrate 10. From a point of view of intimate contact and capability of heat conduction, the sphericity error can be not greater than 10.0 μm, not greater than 7.0 μm, not greater than 5.0 μm, or not greater than 3.0 μm, and it is ideally 0 μm. In consideration of industrial productivity, the sphericity error can be approximately not smaller than 1.0 μm.

In order to manufacture composite member 1 of which sphericity error satisfies the range, for example, a method of manufacturing a composite member in the embodiment which will be described later, for example, with the use of a spherical die of which radius of curvature Rd satisfies the range, is employed.

Amount of Warpage

Composite member 1 in the embodiment has an amount of warpage in accordance with radius of curvature R. The amount of warpage is determined, for example, by analyzing a surface shape of a warped portion of substrate 10 with the three-dimensional measurement apparatus described above and adopting a maximum amount of displacement (μm) found by using a result of analysis. Simply put, the amount of warpage refers to a difference in height between a lowest position and a highest position with the lowest position when the warped portion of substrate 10 is laterally viewed being defined as the reference of the height. Although depending on a size of composite member 1, a specific amount of warpage (mm) is, for example, not smaller than 50 μm and not greater than 600 μm and approximately not greater than 400 μm in rectangular substrate 10 of a size from 130 mm long×70 mm wide to 200 mm long×150 mm wide.

<Residual Stress>

When composite member 1 in the embodiment has projecting warpage in one surface and recessed warpage in the other surface, it is preferably small in difference in residual stress between the projecting surface and the recessed surface in the warped portion of substrate 10. As the difference in residual stress is smaller, deformation due to release of residual stress is more readily suppressed in application of a thermal history such as a thermal cycle or soldering. Quantitatively, an absolute value |X1−X2| of a difference in residual stress between the projecting surface and the recessed surface is smaller than $10^5 \times (H/L^2)$ (MPa), where X1 (MPa) represents residual stress at the gravity center position described above in the projecting surface of substrate 10, X2 (MPa) represents residual stress at the gravity center position described above in the recessed surface, L (mm) represents a length of a diagonal of the rectangle containing the outer periphery of substrate 10, and H (mm) represents a thickness of substrate 10. Based on formulae associated with beams, a tension T applied in the direction of the long side of substrate 10 at the time of application of a load P in the direction of thickness of substrate 10 is expressed as $T=6E\times\delta\times(H/l^2)$ where E represents a Young's modulus of substrate 10, δ represents an amount of deflection, l represents a length of the long side of substrate 10, and H represents a thickness of substrate 10. When amount of deflection δ refers to an amount of restoration of warpage and tension T is based on difference |X1−X2| in residual stress described above, with a condition smaller than $10^5\times(H/l^2)$ (MPa) being satisfied, it can be concluded that the amount of restoration of warpage can be decreased. The present inventors have found as a result of studies that, when a condition of $10^5\times(H/L^2)$ (MPa) is satisfied with L representing a length of the diagonal of substrate 10, an amount of restoration of warpage can more reliably be made smaller (see Test Example 2 which will be described later). For example, in substrate 10 having a long side having length L of approximately 190 mm and thickness H of 5 mm, amount of restoration of warpage δ due to release of residual stress can be not greater than 100 μm. As difference |X1−X2| (MPa) in residual stress is smaller, restoration of warpage due to residual stress is smaller and deformation is less likely. Therefore, the difference is preferably not greater than $8\times10^4\times(H/L^2)$ (MPa), not greater than $6\times10^4\times(H/L^2)$ (MPa), or not greater than $5\times10^4\times(H/L^2)$ (MPa).

The vicinity of the center of gravity of substrate 10, representatively the vicinity of a vertex of warpage, is considered to most tend to have residual stress. Therefore, the residual stress described above is measured at the gravity center position.

In addition to small difference |X1−X2| in residual stress described above, residual stress in the projecting surface and residual stress in the recessed surface in substrate 10 are preferably identical in directivity to each other (stresses identical in sign). Specifically, both of residual stress at the gravity center position described above in the projecting surface and residual stress at the gravity center position described above in the recessed surface of substrate 10 are preferably compressive stress or tensile stress. In this case, even though residual stress is released, deformation is further less likely.

Difference |X1−X2| in residual stress or directivity (sign) of residual stress described above may be adjusted representatively based on a manufacturing condition. Normally, when warpage is provided to a plate-shaped member by pressing by being sandwiched by a punch, generally, residual stress in the projecting surface and residual stress in the recessed surface are reverse to each other in sign. Representatively, tensile stress remains in the projecting surface and compressive stress remains in the recessed surface. In order for residual stresses to be identical in sign between front and rear of substrate 10, internal stress is desirably adjusted by using heat or a pressure to control deformation due to relaxation of stress and a creep phenomenon. By performing heat pressing under a specific condition as in a method of manufacturing a composite member in the embodiment which will be described later, a difference in residual stress can be made smaller, and furthermore, residual stress in the projecting surface and residual stress in the recessed surface can be identical to each other in sign. Other examples of a method of adjusting residual stress include separate heat treatment after heat pressing.

In particular, when Mg—SiC is adopted as the composite material for substrate 10, relaxation of stress is more likely and residual stress is more readily removed in a shorter period of time at a lower temperature than in an example of Al—SiC. Therefore, difference |X1−X2| in residual stress described above tends to decrease and deformation due to residual stress tends to easily be lessened.

<Thermal Characteristics>

Thermal Conductivity and Coefficient of Linear Expansion

Substrate 1 has a thermal conductivity not lower than 150 W/m·K and a coefficient of linear expansion not greater than 10 ppm/K. By adjusting a composition of metal 20, a composition of non-metal 22, and a content thereof, a thermal conductivity can be higher and a coefficient of linear expansion can be smaller. Substrate 10 can have a thermal conductivity, for example, not lower than 180 W/m·K, not lower than 200 W/m·K, or in particular not lower than 220 W/m·K. Substrate 10 composed of a diamond composite material can have a thermal conductivity, for example, not lower than 500 W/m·K, not lower than 520 W/m·K, not lower than 550 W/m·K, or not lower than 600 W/m·K. Substrate 10 can have a coefficient of linear expansion, for example, not greater than 9 ppm/W or not greater than 8 ppm/W. With a smaller coefficient of linear expansion of substrate 10, even though the substrate includes a metallic coating which will be described later, a coefficient of linear expansion of composite member 1 including substrate 10 and the metallic coating can be made smaller and the coefficient of linear expansion can be preferably not greater than 10 ppm/K. Since composite member 1 including substrate 10 having a higher thermal conductivity and a coefficient of linear expansion approximately not smaller than 3 ppm/K and not greater than 10 ppm/K is excellent in compatibility in coefficient of linear expansion with semiconductor element 50 and a peripheral component thereof, it can suitably be used for a material for heat radiation member 3 of semiconductor element 50. So long as compatibility with semiconductor element 50 is excellent, substrate 10 can have a coefficient of linear expansion, for example, not smaller than 3 ppm/K, not smaller than 4 ppm/K, or not smaller than 4.5 ppm/K.

Resistance Against Thermal Deformation

Since composite member 1 in the embodiment includes spherical warpage which satisfies specific radius of curvature R and a specific sphericity error as described above, it is less likely to deform even in application of a thermal cycle. Quantitatively, a rate of variation in radius of curvature R between before and after application of 10, 100, and 1000 thermal cycles from −60° C. to 175° C. is not higher than 20%. The rate of variation (%) in radius of curvature R is expressed as [1−(radius of curvature R of substrate 10 after a prescribed number of thermal cycles)/(radius of curvature R of substrate 10 before the thermal cycles)]×100. The method of measuring radius of curvature R is as described above. Composite member 1 can be concluded as being less likely to deform even though the number of thermal cycles is large, much less when the number of thermal cycles is small. Even when such composite member 1 is used for heat radiation member 3 of semiconductor element 50 and is subjected to a thermal cycle, it is less likely to deform for a long period of time from an initial stage of use and a state of intimate contact with a placement target can be maintained. As the rate of variation in radius of curvature R is lower, the composite member is less likely to deform for a long period of time from the initial stage of use when it is used for a heat radiation member as described above. Therefore, the rate of variation is preferably not higher than 18%, not higher than 15%, or not higher than 10%.

Figure 5:
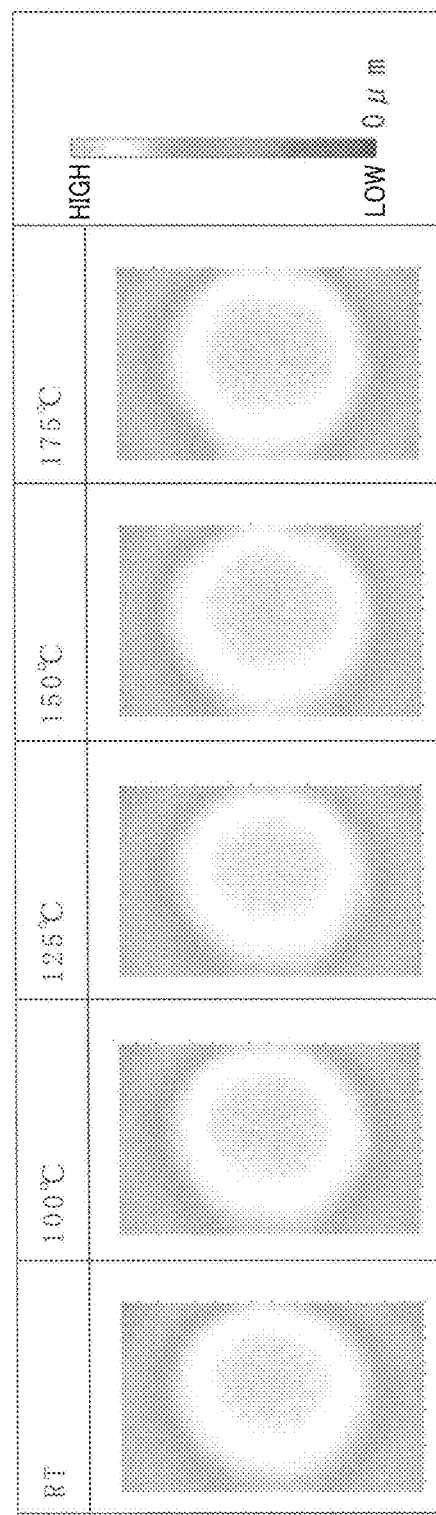
FIG. 5 is an illustrative diagram showing a result of analysis of a surface shape of the composite member in the embodiment before and after a thermal cycle with a three-dimensional measurement apparatus, as being converted into two dimensions.

FIG. 5 shows a two-dimensionally converted image obtained by finding a surface shape of a warped portion of substrate 10 of composite member 1 in the embodiment (Test Example 1 which will be described later, sample No. 1-15, Mg—SiC) with a three-dimensional measurement apparatus as described above and converting a result of analysis in three dimensions into two dimensions. The two-dimensionally converted image is an image at the time when a temperature is set to a room temperature (RT), 100° C., 125° C., 150° C., and 175° C. in the thermal cycle from −60° C. to 175° C. described above. The two-dimensionally converted image for each temperature shows an amount of displacement (μm) from the reference by color on a color scale on the left with displacement of a corner portion of rectangular substrate 10 being defined as the reference (0 μm) as in FIG. 4 described above. As shown in FIG. 5, the two-dimensionally converted image of composite member 1 draws concentric circles around substantially the center of rectangular substrate 10 (the center of gravity in the two-dimensional shape of the outer periphery=the intersection of diagonals) at any temperature. It can thus be seen that, even though composite member 1 is subjected to thermal cycles, the warped portion tends to maintain a surface close to the spherical surface having radius of curvature R and the composite member is less likely to deform.

Since composite member 1 in the embodiment includes spherical warpage which satisfies specific radius of curvature R and a specific sphericity error as described above, it is less likely to deform even in application of heat treatment. Quantitatively, a rate of variation in radius of curvature R between before and after heat treatment at 300° C.×one hour is not higher than 20%. The rate of variation (%) in radius of curvature R is expressed as [1−(radius of curvature R of substrate 10 subjected to heat treatment)/(radius of curvature R of substrate 10 before heat treatment)]×100. The method of measuring radius of curvature R is as described above. It can be concluded that the heat treatment simulates one example of a condition for soldering insulating substrate 52 (FIG. 8). Composite member 1 low in rate of variation in radius of curvature R in spite of application of heat treatment is less likely to deform even when it is used for heat radiation member 3 of semiconductor element 50 and soldered as described above, and can maintain the specific spherical warpage and can be brought in intimate contact with a placement target such as a cooling apparatus by making use of warpage. As the rate of variation in radius of curvature R is lower, the composite member is less likely to deform due to heat treatment such as soldering as described above. Therefore, the rate of variation is preferably not higher than 18%, not higher than 15%, or not higher than 10%.

When composite member 1 does not include a metallic coating but consists substantially of substrate 10, when composite member 1 includes a metallic coating but the metallic coating is small in thickness (preferably the thickness being not greater than 20 μm), when substrate 10 is composed of Mg—SiC, when difference |X1−X2| in residual stress described above is small, or when directivity (sign) of residual stresses is identical, a rate of variation in radius of curvature R in application of a plurality of thermal cycles described above or a rate of variation in radius of curvature R in application of specific heat treatment described above tends to be lower.

<Others>

Metallic Coating

Composite member 1 can include a metallic coating (not shown) in at least a part of a surface of substrate 10. Although depending on a type of a metal making up the metallic coating, the metallic coating has a function to enhance solderability, resistance against corrosion, and design. When composite member 1 is used for heat radiation member 3 of semiconductor element 50, the metallic coating preferably includes a solder underlying layer which improves solderability. The solder underlying layer is desirably provided in a region to be soldered in the surface of substrate 10, and it may be provided in at least a part of one surface of substrate 10 or at least a part of opposing surfaces.

A metal making up the metallic coating may be a metal identical in type to metal 20 for the composite material making up substrate 10 or an alloy based on the same metal if any alloy is employed as metal 20, or may be a metal different in type such as pure nickel or a nickel alloy, zinc or a zinc alloy, or pure gold or a gold alloy. Examples of a metal making up the solder underlying layer include pure nickel, a nickel alloy, pure copper, a copper alloy, pure gold, a gold alloy, pure silver, and a silver alloy. The metallic coating can have a single-layered structure and a multi-layered structure including a plurality of metal layers different in constituent metal.

When a metallic coating is provided on one surface of substrate 10, a thickness (a total thickness in an example of a multi-layered structure, which should be understood similarly in connection with a thickness of the metallic coating) of the metallic coating is preferably uniform and relatively small. When a metallic coating is provided on each of opposing surfaces of substrate 10, preferably, metallic coatings on opposing surfaces are substantially equal to each other in thickness and the thickness is relatively small. When the metallic coating is too large in thickness or metallic coatings are non-uniform in thickness on front and rear surfaces of substrate 10, such a phenomenon that the metallic coating repeats creeping at a high temperature and plastic deformation at a low temperature at the time of application of a thermal cycle and deformation proceeds each time a thermal cycle is applied (a heat ratchet phenomenon) is likely to occur. The metallic coating has a thickness per one surface of substrate 10 preferably not greater than 100 μm, not greater than 80 μm, or not greater than 50 μm, or in particular, not greater than 20 μm, not greater than 18 μm, or not greater than 15 μm. With a small thickness of the metallic coating, increase in coefficient of linear expansion of composite member 1 attributed to the metallic coating can also be lessened.

Attachment Portion

Composite member 1 can include a portion of attachment to a placement target. The attachment portion is provided in substrate 10 itself, and examples thereof include a bolt hole through which a fastening member such as a bolt is inserted. Alternatively, a metal region not containing non-metal 22 is provided in substrate 10, and the metal region can include a bolt hole or a boss portion including a bolt hole. The metal region can be formed, for example, simultaneously with making of a composite of molten metal 20 and non-metal 22. It is considered that an attachment portion provided in a portion distant from a region including spherical warpage in substrate 10 such as a corner portion of substrate 10 or a portion in the vicinity of outer periphery 10e is less likely to affect variation in spherical warpage. A known method can be referred to as a method of forming an attachment portion.

<Application>

Composite member 1 in the embodiment is high in thermal conductivity as described above and small in coefficient of linear expansion, can be brought in intimate contact with a placement target by including specific spherical warpage, and can maintain this state of intimate contact for a long period of time from an initial stage of use. Therefore, the composite member can suitably be used for a heat radiation member. In particular, since composite member 1 is excellent also in compatibility in coefficient of linear expansion with semiconductor element 50 and a peripheral component (not shown) thereof, it can suitably be used for heat radiation member 3 of semiconductor element 50. In addition, composite member 1 in the embodiment is expected to be used as an appropriate structural material which is desirably excellent in capability of heat conduction and small in amount of thermal expansion and shrinkage.

[Heat Radiation Member]

Heat radiation member 3 in the embodiment (see FIG. 8) includes composite member 1 in the embodiment. A shape and a size of heat radiation member 3 can be selected as appropriate so long as a heat generator can be placed thereon. Representatively, since a shape and a size of heat radiation member 3 substantially maintain a shape and a size of substrate 10, the shape and the size of substrate 10 are desirably adjusted. Since heat radiation member 3 in the embodiment includes composite member 1 in the embodiment which is high in thermal conductivity and small in coefficient of linear expansion, can be brought in intimate contact with a placement target by including specific spherical warpage, and can maintain a state of intimate contact for a long period of time from the initial stage of use, it can suitably be used for a heat radiation member of semiconductor element 50 or a constituent element of semiconductor device 5.

[Semiconductor Device]

Semiconductor device 5 in the embodiment includes heat radiation member 3 in the embodiment and semiconductor element 50 mounted on heat radiation member 3 as shown in FIG. 8. One surface of heat radiation member 3 is representatively a mount surface to which semiconductor element 50 is soldered with insulating substrate 52 composed of a non-metal inorganic material such as aluminum nitride (AlN) and solder 54 being interposed, and the other surface thereof is a placement surface for placement of a cooling apparatus (not shown). In a region in the mount surface of heat radiation member 3 to which a mount component such as at least semiconductor element 50 is to be attached, a solder underlying layer such as a plating layer composed of the metal described above is preferably provided. Semiconductor device 5 in the embodiment can be used for various electronic devices, in particular, a high-frequency power device (for example, a laterally diffused metal oxide semiconductor (LDMOS)), a semiconductor laser apparatus, and a light emitting diode device, as well as a central processing unit (CPU), a graphics processing unit (GPU), a high electron mobility transistor (HEMT), a chip set, and a memory chip of various computers.

[Method of Manufacturing Composite Member]

For example, a method of manufacturing a composite member in the embodiment in which such a process as heat pressing is performed under a specific condition below can be employed as a method of manufacturing composite member 1 in the embodiment. The method of manufacturing a composite member in the embodiment allows manufacturing of a composite member by processing a substrate material composed of a composite material containing metal 20 and non-metal 22, the composite member including the processed substrate, and includes a pressing step of performing heat pressing by accommodating the substrate material in a die of which radius of curvature is not smaller than 5000 mm and not greater than 35000 mm. The heat pressing step includes a maintaining step and a cooling step below. In addition, the method of manufacturing a composite member in the embodiment can include a preparation step of preparing a substrate material, a coating step of forming a metallic coating, and a processing step of performing light surface polishing for forming an attachment portion or adjusting surface roughness.

(Maintaining Step)

A step of maintaining a heating temperature exceeding 200° C. and an applied pressure not lower than 10 kPa for a prescribed period of time (Cooling Step)

A step of performing cooling from the heating temperature to a temperature not higher than 100° C. while a state of application of a pressure not lower than 80% of the pressure applied to the substrate material is maintained Each step will be described below.

(Preparation Step)

In this step, a substrate material to be subjected to heat pressing is prepared. For a substrate material, a known manufacturing method for manufacturing a composite material containing metal 20 and non-metal 22 in a plate shape can be employed. Examples of the method include an infiltration method of filling a die with powders or a formed object of non-metal 22 and infiltrating the object with molten metal 20 (see PTL 1), a pressure infiltration method of infiltration at a high pressure, a powder metallurgy method, and a melting method. A commercially available substrate composed of a composite material containing metal 20 and non-metal 22 can also be employed as a material.

Representatively, a thermal conductivity and a coefficient of linear expansion of substrate 10 finally obtained from the substrate material can be set to desired values by adjusting specifications such as a composition of metal 20 and a composition, a content, or a form of non-metal 22 (powders or a formed object). In manufacturing composite member 1 in the embodiment, the specifications are desirably adjusted as appropriate so as to satisfy conditions for a thermal conductivity not lower than 150 W/m·K and a coefficient of linear expansion not greater than 10 ppm/K. Although depending on a composition of metal 20 and a composition of non-metal 22, when a content of non-metal 22 in the substrate material is set to 55 volume % or higher, it is easier to obtain composite member 1 in the embodiment having a high thermal conductivity and a small coefficient of linear expansion as described above.

In manufacturing a composite member including a metallic coating, for example, plating, clad rolling, and other known methods can be used as appropriate for forming a metallic coating (see PTL 1). The metallic coating can be formed before or after heat pressing (a pressing step) below (one example of the coating step). In preparing a substrate material including a metallic coating before heat pressing and then subjecting the same to heat pressing, the metallic coating is made to be small in thickness as described above and preferably uniform in thickness. Then, variation in warpage during heat pressing caused by providing the metallic coating can be lessened and prescribed warpage can preferably accurately be formed. In this case, the metallic coating is formed, for example, simultaneously with making of a composite of molten metal 20 and non-metal 22 in manufacturing of substrate 10 (see PTL 1). The obtained substrate material includes, directly on substrate 10, a metallic coating composed of a metal identical in type to metal 20 of substrate 10 and including a structure continuous to metal 20 of substrate 10. A metallic coating can also be formed separately from a step of making a composite of metal 20 and non-metal 22 by using plating described above. When a metallic coating is formed after heat pressing, variation in warpage caused by providing the metallic coating during heat pressing can be prevented, and prescribed warpage can preferably highly accurately be formed. In this case, a formation method without substantially varying warpage, such as plating, can suitably be used for forming a metallic coating. In any case, the metallic coating is preferably small in thickness (not greater than 20 μm) and uniform in thickness such that the obtained composite member is less likely to deform in application of a thermal history such as a thermal cycle as described above. With plating, a metallic coating small in thickness is readily formed, and in addition, the thickness is readily made uniform in principles. It is thus considered that the substrate can suitably be used.

(Pressing Step)

In this step, representatively, dies including a first die having a spherically projecting surface of which radius of curvature Rd satisfies the specific range described above and a second die having a spherically recessed surface are used to perform heat pressing. A substrate having spherical warpage of which radius of curvature satisfies a condition of Rd≈R or ideally spherical warpage of which radius of curvature satisfies a condition of Rd=R is manufactured by sandwiching a substrate material between the first die and the second die, applying a pressure in a heated state, and transferring a spherical surface having radius of curvature Rd to the substrate material. The section which describes radius of curvature R above is to be referred to for radius of curvature Rd of the first die and the second die.

For example, when a rectangular substrate material is employed, the substrate material is accommodated in the dies such that the center of the substrate material (the intersection of diagonals=the center of gravity in the surface shape of the outer periphery) matches with the centers of the spherical surfaces of the first die and the second die. By doing so, a composite member having spherical warpage around the center of gravity (≈the center of the substrate material) in the surface shape of the outer periphery of the rectangular substrate of which radius of curvature satisfies the condition of R≈Rd (ideally R=Rd) is finally obtained.

Maintaining Step

By setting a heating temperature (a heating temperature of the die) during heat pressing to a temperature exceeding 200° C. and an applied pressure to 10 kPa or higher, even a substrate material containing non-metal 22 can plastically be deformed and specific spherical warpage can be provided. Plastic deformation is more likely to occur as the heating temperature is higher. Therefore, the heating temperature can be set to a temperature exceeding 250° C., not lower than 280° C., or not lower than 300° C. Plastic deformation is more likely to occur as the applied pressure is higher. Therefore, the applied pressure can be not lower than 100 kPa, not lower than 500 kPa, or not lower than 700 kPa. Residual stress tends to be smaller as the heating temperature is higher and the applied pressure is higher. Consequently, a composite member having specific spherical warpage and less likely to deform even in application of a thermal history such as a thermal cycle as described above can be manufactured. From a point of view of decrease in residual stress or deformation, the heating temperature can be not lower than 350° C., not lower than 380° C., or not lower than 400° C., and the applied pressure can be not lower than 800 kPa, not lower than 900 kPa, or not lower than 1 MPa. Depending on a composition of a substrate material, the heating temperature can be not lower than 500° C. and the applied pressure can be not lower than 10 MPa or not lower than 20 MPa. By sufficiently maintaining a relatively high temperature and a relatively high pressure (see also a maintaining time period and a rate of cooling which will be described later), the specific spherical warpage can more accurately be provided. The upper limit of the heating temperature can be selected within a range lower than a temperature of a liquidus of metal 20 making up the substrate material in which metal 20 or non-metal 22 is less likely to thermally deteriorate. The upper limit of the applied pressure can be selected within a range not causing a fracture of the substrate material.

In addition to heating of the die to the heating temperature described above, the substrate material is also preferably heated (pre-heated). Such an effect that, with uniform heating of the substrate material, uniform plastic deformation is readily achieved and forming can be highly accurate or a fracture due to a difference in temperature between the die and the substrate material is less likely can be expected. From a point of view of the effect, the substrate material heated to a heating temperature of the die±20° C. or a heating temperature of the die±10° C. or heated preferably to a temperature as high as the heating temperature of the die is preferably accommodated in the die.

A time period of maintaining the heated and pressurized state described above can be selected as appropriate depending on a composition of a substrate material, and can be selected, for example, within a range not shorter than ten seconds and not longer than 180 minutes. More specific examples include a time period approximately not shorter than one minute and not longer than five minutes for Mg—SiC and a time period approximately not shorter than one minute and not longer than 100 minutes for Al—SiC. When a substrate material composed of Mg—SiC is employed, specific spherical warpage described above may be formed even though the time period of maintaining during heat pressing is shorter than in the example of Al—SiC, and the substrate material composed of Mg—SiC is higher in manufacturability.

Cooling Step

After lapse of the maintaining time period described above, cooling from the heating temperature described above to a room temperature (for example, approximately from 10° C. to 20° C.) is performed. Within the range from the heating temperature to 100° C. in the cooling process, cooling is performed in a pressurized state. The applied pressure in the cooling process is set to at least 80% of the pressure applied during heat pressing described above. By performing cooling in such a specific pressurized state, deformation due to local heat shrinkage caused by non-uniform cooling is suppressed and specific spherical warpage described above can highly accurately be provided. By suppressing local heat shrinkage due to non-uniform cooling, residual stress is also readily prevented. Too high a pressure applied during the cooling process may lead to a fracture or increase in internal stress with new deformation caused during cooling. Therefore, the applied pressure is preferably adjusted within a range equal to or lower than the pressure applied during heat pressing (100% or lower of the pressure applied during heat pressing). In the cooling process, cooling may be performed within a range from a temperature lower than 100° C. to a room temperature in a non-pressurized and unloaded state.

Within a range of cooling in the specific pressurized state described above in the cooling process described above, slow cooling is preferably performed because the pressurized state in the cooling process described above can sufficiently be ensured and specific spherical warpage described above can accurately be provided (see also Test Examples which will be described later). With rapid cooling (representatively, a rate of cooling being not less than 10° C./min.), it is difficult to uniformly cool the entire substrate material due to a difference in thermal capacity or thermal conductivity between the die and the substrate material. Therefore, local cooling occurs, thermal stress is produced, and consequently internal stress or deformation is caused. Slow cooling satisfies a condition of a rate of cooling not more than 3° C./min. The rate of cooling can be set to be not more than 1° C./min. or not more than 0.5° C./min. A temperature around the die may be adjusted or a state of cooling by a forced cooling mechanism may be adjusted such that the rate of cooling satisfies the range above. Slow cooling is considered as being preferable in using a substrate material high in content of non-metal 22 such as not lower than 55 volume %, not lower than 60 volume %, or not lower than 65 volume % and relatively high in rigidity.

Through the pressing step described above, by using the substrate material, a composite member having spherical warpage of which radius of curvature R is not smaller than 5000 mm and not greater than 35000 mm and sphericity error described above is not greater than 10.0 µm is obtained. Composite member 1 in the embodiment is obtained by using a substrate material of which thermal conductivity and coefficient of linear expansion satisfy the specific ranges described above as the substrate material.

The substrate material described above may be cut or polished in the method of manufacturing composite member 1 in the embodiment. In providing the specific spherical warpage described above to the substrate material composed of the composite material containing at least 50 volume % of SiC or diamond, heat pressing described above is preferably employed rather than cutting or polishing. Since a substrate material composed of a composite material containing at least 50 volume % of SiC or diamond is generally very hard, there is substantially no cutter which can cut the substrate material. Even though a diamond grindstone is used, polishing for a long period of time is required and a high pressure should be applied between the grindstone and the substrate material. Application of a high pressure leads to springback or accumulation of residual stress in the substrate material and also to difficulty in working into a precise three-dimensional shape. Since the diamond grindstone is very expensive, it is not applied to industrial production.

(Other Steps)

<Heat Treatment Before Heat Pressing>

Heat treatment can be performed before the pressing step described above. This heat treatment may be able to lessen or remove residual stress produced during making of a composite. Although depending on a composition of a substrate material, examples of a condition for heat treatment include a heating temperature approximately not lower than 350° C. and not higher than 550° C. (for example, approximately 400° C.) and a maintaining time period approximately not shorter than 30 minutes and not longer than 720 minutes (for example, approximately 60 minutes).

<Heat Treatment After Heat Pressing>

Heat treatment can be performed after the pressing step described above. By adjusting a condition for heat treatment, residual stress provided to the substrate during the pressing step described above may be adjusted, lessened, or removed. Although depending on a composition of a substrate material, heat treatment, for example, under a condition of a heating temperature not lower than 100° C. and not higher than 200° C. and a maintaining time period not shorter than 100 hours and not longer than 1000 hours readily removes residual stress. When residual stress is removed after the pressing step, deformation may occur simultaneously with removal. Therefore, conditions for pressing are desirably adjusted such that residual stress is substantially not produced in the pressing step.

Test Example 1

A substrate material composed of Mg—SiC and a substrate material composed of Al—SiC were subjected to heat pressing under various conditions to fabricate composite members with warpage, and a warped state was checked.

A substrate not provided with a metallic coating but consisting substantially of a composite material was adopted as a composite member in each sample and fabricated as below.

(Sample Containing Mg—SiC)

A sample containing Mg—SiC was fabricated with an infiltration method described in PTL 1, which will be outlined below.

An ingot composed of pure magnesium in which at least 99.8 mass % of a metal for a source material was Mg and the remainder was composed of an inevitable impurity was adopted. SiC powders as a source material were coated powders subjected to oxidation treatment and having an average particle size of 90 Lm. The source materials are commercially available.

A die (a die composed of graphite) was filled with the prepared coated powders (a filling factor of SiC powders with respect to a cavity being 70 volume %). Thereafter, the ingot was molten and the coated powders filled in the die were infiltrated therewith. A condition for infiltration includes an infiltration temperature of 875° C., an Ar atmosphere, and a pressure of the atmosphere at an atmospheric pressure. After infiltration, cooling was performed to solidify pure magnesium, and thereafter a formed object was taken out of the die. The formed object was a plate-shaped material of 190 mm long×140 mm wide×5 mm thick, and the rectangular formed object was adopted as a substrate material. The substrate material was substantially identical in composition to the source materials used, and a content of SiC in the substrate material was substantially equal to the filling factor (70 volume %) in the die (which is also applicable to a sample containing Al—SiC).

(Sample Containing Al—SiC)

A sample containing Al—SiC was fabricated with a pressure infiltration method. A sample was fabricated similarly to the sample containing Mg—SiC except that a metal as a source material was changed to an ingot composed of pure aluminum in which at least 99.8 mass % was composed of Al and the remainder was composed of an inevitable impurity, a metal die was employed as the die, and a condition for infiltration was changed (an infiltration temperature of 750° C., an Ar atmosphere, and an applied pressure being selected within a range not lower than 15 MPa and not higher than 30 MPa). The obtained rectangular formed object, that is, a plate-shaped material of 190 mm long×140 mm wide×5 mm thick, was adopted as the substrate material.

(Heat Pressing)

The substrate material in each sample was accommodated in a spherical die (a first die having a spherically projecting surface and a second die having a spherically recessed surface) and subjected to heat pressing. Table 1 shows conditions for heat pressing (a radius of curvature Rd (mm) of the die, a heating temperature (° C.) of the die, an applied pressure (kPa or MPa), and a maintaining time period (min.)).

Heat pressing was performed by pre-heating not only the die but also the substrate material to the heating temperature shown in Table 1. The substrate material was accommodated in the die such that the center of the pre-heated substrate material (the intersection of diagonals of the rectangle=the center of gravity in the surface shape of the outer periphery) matched with the center of the spherical surfaces of the first die and the second die. After lapse of the maintaining time period, cooling from the heating temperature to a room temperature (approximately 20° C.) was performed. The obtained heat-pressed product was adopted as the composite member (substrate) in each sample. The heat radiation member (substrate) in each sample had projecting warpage in one surface and recessed warpage in the other surface. A plurality of composite members (substrates) were prepared for each sample and used for measurement and evaluation which will be described later (this is also applicable to Test Examples 2 and 3 which will be described later).

A sample which was cooled while a pressurized state at at least 80% of the pressure applied during heat pressing was maintained within a range from the heating temperature to 100° C. in the cooling process is shown in Table 1 as "Yes in Application of Pressure During Cooling" and a sample which was cooled in a non-pressurized state with a pressurized state being canceled after lapse of the maintaining time period is shown in Table 1 as "No in Application of Pressure During Cooling." A pressure applied during cooling is selected within a range not lower than 80% and not higher than 100% of the pressure applied during heat pressing.

A sample of which rate of cooling was not more than 3° C./min. within the range from the heating temperature to 100° C. in the cooling process is shown in Table 1 as "Slow Cooling in Rate of Cooling" and a sample of which rate of cooling was more than 10° C./min. is shown in Table 1 as "Rapid Cooling in Rate of Cooling." An ambient temperature or a forced cooling mechanism were adjusted to achieve the rate of cooling above.

(Measurement and Evaluation)

Table 1 shows radius of curvature R (mm), sphericity error E (μm), and an amount of warpage (μm) of the composite member (substrate) in each sample.

Details of a method of measuring sphericity error E and radius of curvature R are as described above and outlined below. A composite member in each sample was a rectangular plate-shaped material approximately having a size of 190 mm×140 mm in a plan view. In the composite member (substrate) in each sample, the center of gravity (which substantially matched with the intersection of diagonals of the rectangle) was taken in the main surface having projecting warpage, and rectangular measurement region $10\alpha$ having a long side of 170 mm and a short side of 120 mm was extracted. Contour extraction lines L1 to L10 in parallel to the long sides of the rectangle were taken in measurement region $10\alpha$. Contour extraction lines L1 and L10 are straight lines defining respective long sides and contour extraction lines L2 to L9 are straight lines in parallel to the long sides, and they divide the short side in nine equal sections. A plurality of measurement points defining a contour were set along each contour extraction line Ln by using a commercially available three-dimensional measurement apparatus. An average value described above was adopted as a value at each measurement point. This measurement was conducted representatively by arranging a composite member in each sample on a base such that the main surface including projecting warpage faced up. Approximate arc $10\gamma_n$ was found by approximating the plurality of measurement points with the least square method for each set $10\beta_n$ of measurement points. An average of distances d between measurement points in set $10\beta_n$ and approximate arcs $10\gamma_n$ was defined as sphericity error E. An average of radii $R_n$ of ten approximate arcs $10\gamma_n$ was defined as radius of curvature R of the composite member (substrate), where n was from 1 to 10.

A surface shape of the composite member (substrate) in each sample was analyzed with a commercially available three-dimensional measurement apparatus and a maximum amount of displacement (μm) in a result of analysis was adopted as an amount of warpage. An amount of displacement was checked along a longitudinal direction (the direction of the long side) of the substrate and a maximum amount of displacement was adopted as the amount of warpage.

A thermal conductivity and a coefficient of linear expansion of the composite member (substrate) in each sample were measured. A measurement test piece was cut from the composite member in each sample and subjected to measurement with a commercially available measurement instrument. The thermal conductivity was measured at a room temperature (approximately 20° C.). The coefficient of linear expansion was measured within a range from 30° C. to 150° C.

A state of deformation due to a thermal cycle of the composite member (substrate) in each sample was checked. A rate of variation (%) in radius of curvature R between before and after application of 10, 100, and 1000 thermal cycles from −60° C. to 175° C. was checked. A radius of curvature before application of the thermal cycles is denoted as $R_0$, a radius of curvature after 10 cycles is denoted as $R_{10}$, and a rate of variation in radius of curvature after 10 cycles is expressed as $|1-(R_{10}/R_0)| \times 100$. A radius of curvature after 100 cycles is denoted as $R_{100}$ and a rate of variation in radius of curvature after 100 cycles is expressed as $|1-(R_{100}/R_0)| \times 100$. A radius of curvature after 1000 cycles is denoted as $R_{1000}$ and a rate of variation in radius of curvature after 1000 cycles is expressed as $|1-(R_{1000}/R_0)| \times 100$. When a rate of variation in each of three types of radii of curvature is not higher than 20%, a substrate is evaluated as being less likely to deform and shown with "G" in Table 1. When a rate of variation in one of the three types of radii of curvature described above exceeds 20%, a substrate is evaluated as being likely to deform and shown with "B" in Table 1. A method of measuring radius of curvature R after each cycle is similar to the measurement method described above.

The composite member (substrate) in each sample was subjected to heat treatment at 300° C.×one hour and a state of deformation thereof in the heat treatment was checked. A rate of variation (%) in radius of curvature R between before and after heat treatment was checked and a state of deformation was evaluated based on whether the rate of variation was high or low. A substrate of which rate of variation between before and after heat treatment is not higher than 20% is evaluated as a substrate less likely to deform and shown with "G" in Table 1 and a substrate of which rate of variation exceeds 20% is evaluated as a substrate likely to deform and shown with "B" in Table 1.

TABLE 1

| | | | Conditions for Heat Pressing | | | | | |
|---|---|---|---|---|---|---|---|---|
| Sample No. | Material Substrate | Radius of Curvature of Die Rd (mm) | Heating Temperature (° C.) | Applied Pressure (kPa or MPa) | Maintaining Time Period (min.) | Rate of Cooling | Application of Pressure During Cooling | Substrate Amount of Longitudinal Warpage (μm) |
| 1-101 | AlSiC | 10000 | 550 | 40 kPa | 3 | Rapid Cooling | Yes | 340 |
| 1-1 | AlSiC | 10000 | 550 | 40 kPa | 3 | Slow Cooling | Yes | 380 |
| 1-102 | AlSiC | 10000 | 550 | 40 kPa | 3 | Slow Cooling | No | 260 |
| 1-2 | AlSiC | 10000 | 400 | 20 MPa | 1 | Slow Cooling | Yes | 350 |
| 1-3 | AlSiC | 10000 | 550 | 20 MPa | 100 | Slow Cooling | Yes | 390 |
| 1-4 | AlSiC | 10000 | 450 | 40 kPa | 4 | Slow Cooling | Yes | 220 |
| 1-5 | AlSiC | 5000 | 550 | 40 kPa | 3 | Slow Cooling | Yes | 570 |
| 1-6 | AlSiC | 15000 | 550 | 40 kPa | 3 | Slow Cooling | Yes | 240 |
| 1-7 | AlSiC | 20000 | 550 | 40 kPa | 3 | Slow Cooling | Yes | 180 |
| 1-11 | MgSiC | 10000 | 300 | 10 kPa | 1 | Slow Cooling | Yes | 220 |
| 1-12 | MgSiC | 10000 | 400 | 10 kPa | 1 | Slow Cooling | Yes | 240 |
| 1-13 | MgSiC | 10000 | 400 | 100 kPa | 1 | Slow Cooling | Yes | 310 |
| 1-14 | MgSiC | 10000 | 400 | 1 MPa | 1 | Slow Cooling | Yes | 320 |
| 1-15 | MgSiC | 10000 | 400 | 20 MPa | 1 | Slow Cooling | Yes | 380 |
| 1-16 | MgSiC | 10000 | 400 | 100 MPa | 1 | Slow Cooling | Yes | 390 |
| 1-111 | MgSiC | 10000 | 400 | 100 kPa | 1 | Rapid Cooling | Yes | 310 |
| 1-112 | MgSiC | 10000 | 400 | 100 MPa | 1 | Rapid Cooling | Yes | 390 |
| 1-113 | MgSiC | 10000 | 400 | 100 kPa | 1 | Slow Cooling | No | 260 |
| 1-114 | MgSiC | 10000 | 400 | 100 MPa | 1 | Slow Cooling | No | 380 |
| 1-115 | MgSiC | 2500 | 400 | 100 MPa | 1 | Slow Cooling | Yes | 1550 |
| 1-17 | MgSiC | 5000 | 400 | 100 kPa | 1 | Slow Cooling | Yes | 470 |
| 1-18 | MgSiC | 15000 | 400 | 100 kPa | 1 | Slow Cooling | Yes | 220 |
| 1-19 | MgSiC | 20000 | 400 | 100 kPa | 1 | Slow Cooling | Yes | 170 |
| 1-20 | MgSiC | 30000 | 400 | 100 kPa | 1 | Slow Cooling | Yes | 120 |

| | Substrate | | | |
|---|---|---|---|---|
| Sample No. | Radius of Curvature R of Spherical Warpage (mm) | Sphericity Error E (μm) | Deformation in Thermal Cycle | 300° C. × 1 H Deformation |
| 1-101 | 14200 | 19.0 | B | B |
| 1-1 | 13900 | 6.7 | B | B |
| 1-102 | 15800 | 19.6 | B | B |
| 1-2 | 11700 | 4.7 | B | B |
| 1-3 | 10400 | 3.5 | G | G |
| 1-4 | 18300 | 7.1 | B | B |
| 1-5 | 7100 | 6.1 | B | B |
| 1-6 | 16900 | 6.6 | B | B |
| 1-7 | 22300 | 6.1 | B | B |

TABLE 1-continued

| | | | | |
|---|---|---|---|---|
| 1-11 | 18100 | 7.2 | G | G |
| 1-12 | 16600 | 4.6 | G | G |
| 1-13 | 13100 | 3.1 | G | G |
| 1-14 | 12600 | 1.6 | G | G |
| 1-15 | 10700 | 1.8 | G | G |
| 1-16 | 10300 | 1.5 | G | G |
| 1-111 | 13000 | 12.0 | B | B |
| 1-112 | 10300 | 10.1 | B | B |
| 1-113 | 15700 | 14.1 | B | B |
| 1-114 | 10700 | 12.0 | B | B |
| 1-115 | 2600 | 1.6 | G | G |
| 1-17 | 8600 | 2.0 | G | G |
| 1-18 | 18100 | 2.0 | G | G |
| 1-19 | 23600 | 2.5 | G | G |
| 1-20 | 32400 | 2.0 | G | G |

The composite members in samples Nos. 1-1 to 1-7 composed of Al—SiC had a thermal conductivity of the substrate of 180 W/m·K and a coefficient of linear expansion of the substrate of 7.5 ppm/K. The composite members in samples Nos. 1-11 to 1-20 composed of Mg—SiC had a thermal conductivity of the substrate of 220 W/m·K which was higher than that of the samples composed of Al—SiC and a coefficient of linear expansion of the substrate of 7.5 ppm/K.

As shown in Table 1, it can be seen that the composite members in samples Nos. 1-1 to 1-7 and 1-11 to 1-20 had spherical warpage high in sphericity of which radius of curvature R was not smaller than 5000 mm and sphericity error E was as small as 10.0 μm or smaller in the substrate. There are also a large number of samples of which sphericity error is not greater than 5.0 μm or not greater than 3.0 μm. Such a surface shape of the warped portion can be concluded as a shape close to a part of the spherical surface (spherical cap). The composite member in the sample having warpage high in sphericity is expected to be able to maintain a state of intimate contact with a placement target in a stable manner when it is used for a heat radiation member of a semiconductor element.

As shown in Table 1, it can be seen that a composite member having specific spherical warpage of which radius of curvature R and sphericity error E satisfy the specific ranges described above can be manufactured by performing heat pressing for forming at a specific heating temperature and at a specific applied pressure and performing cooling in the specific pressurized state (for example, see comparison between sample No. 1-1 and sample No. 1-102 and comparison between samples Nos. 1-13 and 1-16 and samples Nos. 1-113 and 1-114). It is considered that warpage high in sphericity of which sphericity error E was as small as 10.0 μm or smaller was highly accurately provided also by setting slow cooling as cooling in the pressurized state and ensuring a relatively long maintaining time period in the pressurized state in the cooling process in this test (for example, see comparison between sample No. 1-1 and sample No. 1-101 and comparison between samples Nos. 1-13 and 1-16 and samples Nos. 1-111 and 1-112) and by pre-heating the substrate material (this is also applicable to Test Examples 2 and 3 which will be described later).

In addition, the test can be concluded below.

(a) When a heating temperature is increased and an applied pressure is increased during heat pressing (a temperature exceeding 300° C. and a pressure exceeding 10 kPa), the sphericity error tends to be smaller (for example, see comparison between sample No. 1-11 and samples Nos. 1-12 to 1-16).

(b) Mg—SiC is more readily made smaller in sphericity error E than Al—SiC by lowering a heating temperature, lowering an applied pressure, or decreasing a maintaining time period (for example, see comparison between samples Nos. 1-12 to 1-14 and samples Nos. 1-1 to 1-3).

(c) Even though a pressure applied during heat pressing is high, specific spherical warpage described above cannot accurately be provided unless a specific pressurized state is set in the cooling process (when cooling is performed without a pressure being applied) (see sample No. 1-114).

(d) Mg—SiC is less likely to deform than Al—SiC even though heat treatment or a thermal cycle is applied (see comparison between samples Nos. 1-11 to 1-20 and samples Nos. 1-1, 1-2, and 1-4 to 1-7). The sample composed of Mg—SiC achieved a rate of variation in radius of curvature after 10 cycles, a rate of variation in radius of curvature after 100 cycles, and a rate of variation in radius of curvature after 1000 cycles not higher than 20%.

(e) A substrate small in radius of curvature tends to be large in amount of warpage (see samples Nos. 1-115, 1-5, and 1-17).

Test Example 2

A warped composite member was fabricated as in Test Example 1 and a state of warpage and residual stress were checked.

(Preparation of Substrate Material)

In this test, a composite member with a metallic coating and a composite member without a metallic coating as in Test Example 1 were fabricated.

A substrate material to be used for a composite member without a metallic coating was fabricated as in Test Example 1 and formed into a similar shape (a rectangular plate of 190 mm long×140 mm wide×5 mm thick).

A substrate material with a coating to be used for a composite member with a metallic coating was fabricated as below. A coated formed object obtained by subjecting a commercially available plate-shaped SiC sintered material (a porous formed object of which relative density was 80%) to oxidation treatment at 875° C.×two hours was prepared. The coated formed object and a spacer (see PTL 1) having a prescribed thickness were accommodated in a die. A metallic coating was formed simultaneously with making of a composite of a molten metal and the coated formed object. Metallic coatings substantially identical in thickness were fabricated on respective front and rear surfaces of a plate composed of a composite material which was a composite of the metal and the coated formed object. Table 2 shows a thickness (μm, equal to a thickness of the spacer) of the metallic coating on each surface of the plate composed of the composite material. The metallic coating was composed of a metal the same as the metal for the composite material and had a structure continuous to the metal for the plate composed of the composite material. The substrate material with a coating was similar in shape and size to the substrate material without a metallic coating (a rectangular plate of 190 mm long×140 mm wide×5 mm thick). A thickness of the SiC sintered material was adjusted such that a total thickness of the metallic coating and the plate composed of the composite material was set to 5 mm.

(Heat Pressing)

The substrate material in each sample and the substrate material with a coating were subjected to heat pressing as in Test Example 1 and an obtained heat-pressed product was adopted as a composite member (substrate) in each sample. Table 2 shows conditions for heat pressing. In this test, a substrate material was pre-heated, the substrate material was accommodated in the die such that the center of the die and the center of the substrate material were aligned with each other, and the cooling process was controlled as in Test Example 1.

(Measurement and Evaluation)

Table 2 shows radius of curvature R (mm), sphericity error E (μm), a thermal conductivity (W/m·K), a coefficient of linear expansion (ppm/K), residual stress X1 (MPa) in the projecting surface, residual stress X2 (MPa) in the recessed surface, and difference |X1−X2| (MPa) in residual stress of the composite member (substrate) in each sample.

Radius of curvature R, sphericity error E, a thermal conductivity, and a coefficient of linear expansion were measured as in Test Example 1.

Residual stress was measured at the gravity center position in the surface shape of the outer periphery of the substrate in the projecting surface of the rectangular substrate and at the gravity center position in the surface shape of the outer periphery of the substrate in the recessed surface of the rectangular substrate. Measurement was conducted representatively by arranging a composite member in each sample on a base such that the projecting surface faced up. A commercially available strain gauge can be used for measurement of residual stress. In measuring residual stress in a breakdown test, a composite member (substrate) for measurement of residual stress which was different from a composite member (substrate) to be subjected to other measurement and evaluation and was not subjected to a thermal cycle or heat treatment which will be described later was prepared.

A rate of variation in radius of curvature R between before and after a thermal cycle and a rate of variation in radius of curvature R between before and after heat treatment at 300° C.×one hour of the composite member (substrate) in each sample were checked and evaluated as in Test Example 1. Table 2 shows results.

TABLE 2

| | | Conditions for Heat Pressing | | | | | | | |
|---|---|---|---|---|---|---|---|---|---|
| Sample No. | Material Substrate | Radius of Curvature of Die Rd (mm) | Heating Temperature (° C.) | Applied Pressure | Maintaining Time Period (min.) | Rate of Cooling | Application of Pressure During Cooling | Presence of Metallic Coating | Substrate Radius of Curvature R of Warpage (mm) |
| 2-1 | AlSiC | 10000 | 550 | 20 MPa | 100 | Slow Cooling | Yes | None | 10400 |
| 2-101 | AlSiC | 10000 | 550 | 20 MPa | 100 | Rapid Cooling | Yes | None | 10400 |
| 2-102 | AlSiC | 10000 | 550 | 20 MPa | 100 | Slow Cooling | No | None | 10400 |
| 2-4 | AlSiC | 10000 | 550 | 20 MPa | 100 | Slow Cooling | Yes | 100 μm | 10400 |
| 2-5 | AlSiC | 10000 | 550 | 20 MPa | 100 | Slow Cooling | Yes | 50 μm | 10400 |
| 2-6 | AlSiC | 10000 | 550 | 20 MPa | 100 | Slow Cooling | Yes | 15 μm | 10400 |
| 2-11 | MgSiC | 10000 | 400 | 1 MPa | 1 | Slow Cooling | Yes | None | 12600 |
| 2-12 | MgSiC | 10000 | 300 | 10 kPa | 1 | Slow Cooling | Yes | None | 18100 |
| 2-13 | MgSiC | 10000 | 500 | 1 MPa | 1 | Slow Cooling | Yes | None | 11200 |
| 2-111 | MgSiC | 10000 | 200 | 1 MPa | 1 | Slow Cooling | Yes | None | 19000 |
| 2-112 | MgSiC | 10000 | 400 | 1 MPa | 1 | Rapid Cooling | Yes | None | 13000 |
| 2-113 | MgSiC | 10000 | 400 | 1 MPa | 1 | Slow Cooling | No | None | 13500 |
| 2-14 | MgSiC | 10000 | 400 | 1 MPa | 1 | Slow Cooling | Yes | 100 μm | 12600 |
| 2-15 | MgSiC | 10000 | 400 | 1 MPa | 1 | Slow Cooling | Yes | 50 μm | 12600 |
| 2-16 | MgSiC | 10000 | 400 | 1 MPa | 1 | Slow Cooling | Yes | 15 μm | 12600 |
| 2-17 | MgSiC | 10000 | 400 | 1 MPa | 1 | Slow Cooling | Yes | None | 12600 |

| | Substrate | | | Residual Stress | | | Deformation | |
|---|---|---|---|---|---|---|---|---|
| Sample No. | Sphericity Error E (μm) | Thermal Conductivity (W/m · K) | Coefficient of Linear Expansion (ppm/K) | Projecting Side X1 (MPa) | Recessed Side X2 (MPa) | Difference in Residual Stress |X1 − X2| (MPa) | Thermal Cycle | 300° C. × 1 H |
| 2-1 | 3.6 | 180 | 7.5 | −8 | −7 | 1 | G | G |
| 2-101 | 11.1 | 180 | 7.5 | −3 | 11 | 14 | B | B |
| 2-102 | 11.2 | 180 | 7.5 | −6 | 8 | 14 | B | B |
| 2-4 | 5.6 | 180 | 7.5 | −5 | −5 | 0 | B | G |
| 2-5 | 4.6 | 180 | 7.5 | −5 | −5 | 0 | B | G |
| 2-6 | 4.2 | 180 | 7.5 | −5 | −5 | 0 | G | G |
| 2-11 | 1.5 | 220 | 7.5 | −5 | −5 | 0 | G | G |
| 2-12 | 7.0 | 220 | 7.5 | −7 | 1 | 8 | G | G |
| 2-13 | 1.0 | 220 | 7.5 | −3 | −2 | 1 | G | G |
| 2-111 | 7.0 | 220 | 7.5 | −5 | 15 | 20 | B | B |
| 2-112 | 10.2 | 220 | 7.5 | −1 | 12 | 13 | B | B |
| 2-113 | 13.1 | 220 | 7.5 | −3 | 10 | 13 | B | B |
| 2-14 | 1.6 | 220 | 7.5 | −5 | −5 | 0 | B | G |

TABLE 2-continued

| | | | | | | | | |
|---|---|---|---|---|---|---|---|---|
| 2-15 | 1.6 | 220 | 7.5 | −5 | −5 | 0 | B | G |
| 2-16 | 1.6 | 220 | 7.5 | −5 | −5 | 0 | G | G |
| 2-17 | 1.7 | 220 | 7.5 | −5 | −5 | 0 | G | G |

As shown in Table 2, the composite members in samples Nos. 2-1 to 2-6 and 2-11 to 2-17 all had a thermal conductivity of the substrate not lower than 150 W/m·K or not lower than 180 W/m·K here and had a coefficient of linear expansion of the substrate of 7.5 ppm/K. In particular, samples Nos. 2-11 to 2-17 composed of Mg—SiC had a thermal conductivity of the substrate not lower than 200 W/m·K. It can be seen that these composite members had spherical warpage of which radius of curvature R was not smaller than 5000 mm and sphericity error E was not greater than 10.0 μm, that is, warpage high in sphericity, in the substrate. It can be seen that these composite members are less likely to deform even in application of heat treatment. It can further be seen that some of these composite members are less likely to deform even in application of a thermal cycle for a period as long as 1000 cycles. Specifically, samples Nos. 2-1, 2-6, 2-11 to 2-13, 2-16, and 2-17 (which may collectively be called a group of spherical samples below) which satisfy a condition of radius of curvature R not smaller than 5000 mm and not greater than 35000 mm and sphericity error E not greater than 10.0 μm and which have no metallic coating or have a metallic coating small in thickness (not greater than 20 μm/one surface) and have a small difference |X1−X2| in residual stress between front and rear surfaces of the substrate are less likely to deform even in application of a thermal cycle. It can be concluded that these samples are less likely to deform if difference |X1−X2| in residual stress is smaller than $10^5 \times (5/236^2) \approx 9.0$ MPa by using a length of diagonals of the substrate $(190^2+140^2)^{0.5} \approx 236$ mm.

It can be seen that, even though radius of curvature R and sphericity error E as well as difference |X1−X2| in residual stress satisfy the ranges above, with the metallic coating large in thickness (not smaller than 50 μm/one surface), deformation may be caused as a result of a thermal cycle for a long period described above although deformation is less likely to be caused by heat treatment (samples Nos. 2-4, 2-5, 2-14, and 2-15). It was confirmed that the sample large in thickness of the metal coating was low in rate of variation in radius of curvature R and less in deformation when the number of thermal cycles was small, however, with increase in number of thermal cycles, the rate of variation increased and deformation became significant. It is considered that, with the metallic coating large in thickness, a thickness of the metallic coating tends to be non-uniform or a heat ratchet phenomenon tends to occur, and consequently deformation is likely.

It can be seen that, when difference |X1−X2| in residual stress is large (not lower than 9.0 MPa), deformation is likely as a result of application of a thermal cycle or heat treatment (sample No. 2-111) even though radius of curvature R and sphericity error E satisfy the ranges and a metallic coating is not provided. It is considered that, when a thermal cycle or heat treatment was applied, residual stress was released and deformation due to restoration of warpage occurred. It can thus be concluded that, when heat treatment or a thermal cycle is applied for a long period of time, composite members in the group of spherical samples of which radius of curvature R and sphericity error E described above as well as difference |X1−X2| in residual stress satisfy the specific ranges and which have no metallic coating or have a metallic coating small in thickness are preferred.

As shown in Table 2, it can be seen that the composite member of which radius of curvature R and sphericity error E satisfy the specific ranges described above and difference |X1−X2| in residual stress satisfies the specific range described above can be manufactured by performing heat pressing under specific conditions and cooling in a specific pressurized state as in Test Example 1 (for example, see comparison between sample No. 2-1 and sample No. 2-102 and comparison between sample No. 2-17 and sample No. 2-113). In this test, in particular, a composite member in which directivity of residual stresses in front and rear surfaces of the substrate is equal and there is substantially no difference |X1−X2| in residual stress is obtained.

In addition, the test can be concluded below.

(e) In cooling without a pressure being applied, directivity of residual stress is varied between front and rear surfaces of the substrate and difference |X1−X2| in residual stress tends to be great (see samples Nos. 1-102 and 2-113).

(f) In rapid cooling, directivity of residual stress is varied between front and rear surfaces of the substrate and difference |X1−X2| in residual stress tends to be great (see samples Nos. 1-101 and 2-112).

(g) When a heating temperature during heat pressing is low (not higher than 200° C.) and an applied pressure is relatively high (1 MPa), directivity of residual stress is varied between front and rear surfaces of the substrate and difference |X1−X2| in residual stress tends to be great (see sample No. 2-111).

It is considered based on the above that, preferably, a heating temperature is set to a temperature exceeding 200° C., a cooling process is performed with a pressure being applied, and slow cooling is performed.

Difference |X1−X2| in residual stress among samples Nos. 1-1 to 1-7 and 1-11 to 1-20 in Test Example 1 was approximately equal to that in the group of spherical samples in Test Example 2.

Test Example 3

The composite members fabricated in Test Examples 1 and 2 were adopted for heat radiation members of semiconductor elements and a heat radiation property was evaluated.

In this test, composite members each provided with a bolt hole in each of four corners of the composite members fabricated in Test Examples 1 and 2 (having a size of the two-dimensional shape of the outer periphery of approximately 190 mm×approximately 140 mm×5 mm thick) were prepared. A member of which heat radiation property was to be evaluated was fabricated by using the composite member as below.

An insulating substrate was soldered to the center in the recessed surface of each composite member (the gravity center position in the two-dimensional shape of the outer periphery), and a semiconductor element was soldered onto the insulating substrate. An IGBT element was adopted as the semiconductor element and a direct bonded aluminum (DBA) substrate of 50 mm×40 mm×0.6 mm was adopted as the insulating substrate. A soldering temperature was set to 300° C. in each case. A stack of the semiconductor element, the insulating substrate, and the composite member was adopted as the member to be evaluated.

The fabricated member to be evaluated was fastened to a water-cooling cooler kept at 30° C. with a bolt. The projecting surface of the composite member in the member to be evaluated was pressed against the cooler and fastened by inserting a bolt in each of the bolt holes in the four corners of the composite member in this state. Electric power was fed to the semiconductor element in the member to be evaluated set in the cooler and heat of 100 W was generated. Thereafter, power feed and absence of power feed for a prescribed period of time were repeated. "Power feed for 10 minutes and leaving for 10 minutes in the absence of power feed" was defined as one cycle, and 2000 cycles were repeated after generation of heat. A temperature (° C.) of the semiconductor element immediately after power feed for 10 minutes in the first cycle and a temperature (° C.) of the semiconductor element immediately after power feed for 10 minutes in the 2000th cycle were measured, and Table 3 shows a result. A temperature of a semiconductor element is measured, for example, based on temperature dependency of an internal resistance of a semiconductor element. In addition, a commercially available contactless thermometer or a contact thermometer can also be used for measurement of a temperature.

A rate of variation in radius of curvature R between before and after a thermal cycle and a rate of variation in radius of curvature R between before and after heat treatment at 300° C.×one hour were checked as in Test Examples 1 and 2 and evaluated as in Test Examples 1 and 2. Table 3 shows also a result thereof.

between composite members identical in composition. One reason of such a result may be because the warped portion was close in shape to the spherical cap (see also FIGS. 4 and 5), the member to be evaluated could uniformly be brought in intimate contact with the cooler, deformation was less likely to be caused even by heat treatment or a thermal cycle for a long period of time as shown in Table 3, and a state of intimate contact could be maintained.

In this test, it can be seen that tendency was similar when either Mg—SiC or Al—SiC was adopted as a composite material making up the composite member and that a substrate composed of Mg—SiC was lower in temperature of the semiconductor element and higher in heat radiation property. In addition, it was confirmed that, when deformation during heat treatment was less (a ratio of deformation being not higher than 15% or not higher than 10%), a temperature of the semiconductor element was lower and heat radiation property was higher. It was confirmed that, when deformation during the thermal cycle described above was less (a ratio of deformation being not higher than 15% or not higher than 10%), a temperature of the semiconductor element was lower and heat radiation property was higher.

The samples (Nos. 3-2 and 3-14) large in thickness of the metallic coating of which radius of curvature R and sphericity error E satisfied the specific ranges described above were lower in temperature of the semiconductor element in the first cycle but higher in temperature of the semiconductor element in the 2000th cycle than the samples without a coating or the samples small in thickness of a coating (Nos. 3-1, 3-11 to 3-13, and 3-16). Therefore, it can be concluded that, when a metallic coating was provided, a thickness of the metallic coating was preferably smaller than 50 μm or

TABLE 3

| Sample No. | Composition No. | | Substrate | Radius of Curvature R of Spherical Warpage (mm) | Sphericity Error E (μm) | Deformation Thermal Cycle | 300° C. × 1 H | Temperature of Semiconductor Element First Cycle | 2000th Cycle |
|---|---|---|---|---|---|---|---|---|---|
| 3-1 | 2-1 | AlSiC | Without Metallic Coating | 10400 | 3.6 | G | G | 65° C. | 66° C. |
| 3-101 | 2-101 | AlSiC | Without Metallic Coating | 10400 | 11.1 | B | B | 75° C. | 83° C. |
| 3-102 | 2-102 | AlSiC | Without Metallic Coating | 10400 | 11.2 | B | B | 76° C. | 84° C. |
| 3-2 | 2-4 | AlSiC | Metallic Coating of 100 μm | 10400 | 5.6 | B | G | 65° C. | 79° C. |
| 3-111 | 1-115 | MgSiC | Without Metallic Coating | 2600 | 1.6 | G | G | 82° C. | 83° C. |
| 3-11 | 1-17 | MgSiC | Without Metallic Coating | 8600 | 2.0 | G | G | 63° C. | 63° C. |
| 3-12 | 1-18 | MgSiC | Without Metallic Coating | 18100 | 2.0 | G | G | 60° C. | 61° C. |
| 3-13 | 1-19 | MgSiC | Without Metallic Coating | 23600 | 2.5 | G | G | 62° C. | 62° C. |
| 3-112 | 1-20 | MgSiC | Without Metallic Coating | 32400 | 2.0 | G | G | 73° C. | 73° C. |
| 3-113 | 2-112 | MgSiC | Without Metallic Coating | 13000 | 10.2 | B | B | 70° C. | 78° C. |
| 3-114 | 2-113 | MgSiC | Without Metallic Coating | 13500 | 13.1 | B | B | 71° C. | 80° C. |
| 3-14 | 2-14 | MgSiC | Metallic Coating of 100 μm | 12600 | 1.6 | B | G | 60° C. | 74° C. |
| 3-15 | 2-15 | MgSiC | Metallic Coating of 50 μm | 12600 | 1.6 | B | G | 60° C. | 70° C. |
| 3-16 | 2-16 | MgSiC | Metallic Coating of 15 μm | 12600 | 1.6 | G | G | 60° C. | 62° C. |

As shown in Table 3, it can be seen that composite members in samples Nos. 3-1, 3-2, and 3-11 to 3-16 of which radius of curvature R satisfied a condition not smaller than 5000 mm and not greater than 35000 mm and sphericity error E satisfied a condition not greater than 10.0 μm were low in temperature of an element for a long period of time from an initial stage of use as a heat radiation member of a semiconductor element, satisfactorily conducted heat to a placement target, and were excellent in heat radiation property. In the test, these composite members were lower in temperature of the semiconductor element by approximately at least 10° C. than samples Nos. 3-101, 3-102, 3-111, 3-113, and 3-114 of which radius of curvature R and sphericity error E were out of the ranges above, based on comparison not greater than 20 μm as in the present example. The sample (No. 3-112) relatively large in radius of curvature R was higher in temperature of the semiconductor element than the sample smaller in radius of curvature R (for example, No. 3-13). One reason may be because application of a pressure to a placement target was not sufficiently large due to large radius of curvature R. In consideration of better intimate contact and a good heat radiation property of a semiconductor element, radius of curvature R can be concluded as being more preferably, for example, not greater than 32000 mm.

A similar result was obtained also when a direct bonded copper (DBC) substrate was employed as the insulating substrate instead.

The present invention is not limited to these exemplifications but is defined by the terms of the claims and is intended to include any modifications within the scope and meaning equivalent to the terms of the claims.

For example, in Test Examples 1 to 3 described above, a composition, a shape, and a size (a length, a width, and a thickness) of a substrate as well as a thickness, a formation method, and a condition in making a composite, if a metallic coating is included, can be modified as appropriate.

REFERENCE SIGNS LIST 1 composite member; 10 substrate; 20 metal; 22 non-metal; 3 heat radiation member; 5 semiconductor device; 50 semiconductor element; 52 insulating substrate; 54 solder; 10α measurement region; 10c peripheral region; 10e outer periphery; G center of gravity; L1 to L10 contour extraction line

The invention claimed is:

1. A composite member comprising:
a substrate composed of a composite material containing a metal and a non-metal,
one surface of the substrate having spherical warpage of which radius of curvature R is not smaller than 5000 mm and not greater than 35000 mm,
a sphericity error being not greater than 10.0 μm, the sphericity error being defined as an average distance between 20 measurement points at which a contour of a warped portion of the substrate is measured and 10 approximate arcs defined by the 20 measurement points, and
the substrate having a thermal conductivity not lower than 150 W/m·K and a coefficient of linear expansion not greater than 10 ppm/K.

2. The composite member according to claim 1, wherein a content of the non-metal is not lower than 55 volume %.

3. The composite member according to claim 1, wherein a rate of variation in the radius of curvature R between before and after application of 10, 100, and 1000 thermal cycles from −60° C. to 175° C. is not higher than 20%.

4. The composite member according to claim 1, wherein a rate of variation in the radius of curvature R between before and after heat treatment performed at 300° C. for one hour is not higher than 20%.

5. The composite member according to claim 1, wherein one surface of the substrate has spherically projecting warpage and an opposing surface has recessed warpage, and
an absolute value |X1−X2| of a difference in residual stress is less than $10^5 \times (H/L^2)$ (MPa), where X1 (MPa) represents residual stress at a gravity center position in a projecting surface of the substrate, X2 (MPa) represents residual stress at a gravity center position in a recessed surface of the substrate, L (mm) represents a length of a diagonal of a rectangle containing an outer periphery of the substrate, and H (mm) represents a thickness of the substrate.

6. The composite member according to claim 5, wherein both of the residual stress at the gravity center position in the projecting surface of the substrate and the residual stress at the gravity center position in the recessed surface of the substrate are compressive stress or tensile stress.

7. The composite member according to claim 1, wherein magnesium or a magnesium alloy is adopted as the metal, and
the non-metal includes SiC.

8. The composite member according to claim 1, wherein aluminum or an aluminum alloy is adopted as the metal, and
the non-metal includes SiC.

9. A heat radiation member comprising the composite member according to claim 1.

10. A semiconductor device comprising:
the heat radiation member according to claim 9; and
a semiconductor element mounted on the heat radiation member.

* * * * *